(12) United States Patent
Shirakashi et al.

(10) Patent No.: US 7,569,135 B2
(45) Date of Patent: Aug. 4, 2009

(54) ELECTROLYTIC PROCESSING APPARATUS AND SUBSTRATE PROCESSING APPARATUS AND METHOD

(75) Inventors: Mitsuhiko Shirakashi, Tokyo (JP); Masayuki Kumekawa, San Jose, CA (US); Hozumi Yasuda, Tokyo (JP); Itsuki Kobata, Tokyo (JP); Ikutaro Noji, Tokyo (JP); Kaori Yoshida, Tokyo (JP)

(73) Assignee: Ebara Corporation, Tokyo (JP)

( * ) Notice: Subject to any disclaimer, the term of this patent is extended or adjusted under 35 U.S.C. 154(b) by 130 days.

(21) Appl. No.: 11/723,934

(22) Filed: Mar. 22, 2007

(65) Prior Publication Data

US 2007/0181432 A1 Aug. 9, 2007

Related U.S. Application Data

(62) Division of application No. 10/484,452, filed as application No. PCT/JP03/01024 on Jan. 31, 2003, now abandoned.

(30) Foreign Application Priority Data

| Jan. 31, 2002 | (JP) | ............................... 2002-23785 |
| Mar. 29, 2002 | (JP) | ............................... 2002-96230 |
| Nov. 13, 2002 | (JP) | ............................... 2002-330039 |

(51) Int. Cl.
*C25F 3/16* (2006.01)
*B23H 5/06* (2006.01)
(52) U.S. Cl. ........................................ 205/662; 205/641
(58) Field of Classification Search ........................ None
See application file for complete search history.

(56) References Cited

U.S. PATENT DOCUMENTS 5,036,015 A * 7/1991 Sandhu et al. ................. 438/14
5,413,941 A * 5/1995 Koos et al. ..................... 438/16

(Continued)

FOREIGN PATENT DOCUMENTS

EP 1 139 400 12/1999

(Continued)

OTHER PUBLICATIONS

Japanese Office Action issued Oct. 16, 2008 with an English translation.

(Continued)

*Primary Examiner*—Harry D Wilkins, III
(74) *Attorney, Agent, or Firm*—Wenderoth, Lind & Ponack, L.L.P.

(57) ABSTRACT

The present invention replaces all or a portion of substrate processing by chemical-mechanical polishing with electrolytic processing using deionized water, ultrapure water or the like. An electrolytic processing apparatus comprises: a chemical-mechanical polishing section for chemically-mechanically polishing a surface of a substrate; an electrolytic processing section having a processing electrode and a feeding electrode, and also having an ion exchanger provided at least either between the substrate and the processing electrode or between the substrate and the feeding electrode, for electrolytically processing a surface of a workpiece under existence of a solution by applying a voltage between the processing electrode and the feeding electrode; and a top ring capable of freely moving between the chemical-mechanical polishing section and the processing electrode section.

14 Claims, 21 Drawing Sheets

U.S. PATENT DOCUMENTS

| | | | |
|---|---|---|---|
| 5,499,733 A * | 3/1996 | Litvak | 216/38 |
| 5,681,448 A | 10/1997 | Uchiyama | |
| 5,702,563 A * | 12/1997 | Salugsugan et al. | 438/692 |
| 6,277,263 B1 * | 8/2001 | Chen | 205/182 |
| 6,368,493 B1 | 4/2002 | Mori et al. | |
| 6,379,223 B1 * | 4/2002 | Sun et al. | 451/41 |
| 6,592,742 B2 | 7/2003 | Sun et al. | |
| 6,602,396 B2 | 8/2003 | Mori et al. | |
| 6,709,563 B2 | 3/2004 | Nagai et al. | |
| 6,736,952 B2 * | 5/2004 | Emesh et al. | 205/81 |
| 6,743,349 B2 | 6/2004 | Mori et al. | |
| 2003/0040188 A1 * | 2/2003 | Hsu et al. | 438/697 |

FOREIGN PATENT DOCUMENTS

| | | |
|---|---|---|
| JP | 5-4116 | 1/1993 |
| JP | 7-161672 | 6/1995 |
| JP | 09-266194 | 10/1997 |
| JP | 10-180545 | 7/1998 |
| JP | 2000-52235 | 2/2000 |
| JP | 2000-183015 | 6/2000 |
| JP | 2001-64799 | 3/2001 |
| JP | 2001-196355 | 7/2001 |
| JP | 2001-244236 | 9/2001 |
| JP | 2001-338926 | 12/2001 |
| JP | 2001-345293 | 12/2001 |
| JP | 2002-25956 | 1/2002 |
| JP | 2002-343797 | 11/2002 |
| WO | 00/33356 | 6/2000 |
| WO | 02/31231 | 4/2002 |

OTHER PUBLICATIONS

Japanese Office Action issued Oct. 23, 2008 with an English translation.

* cited by examiner electrolytic processing tim

ELECTROLYTIC PROCESSING APPARATUS AND SUBSTRATE PROCESSING APPARATUS AND METHOD

This application is a divisional of U.S. application Ser. No. 10/484,452, filed Jun. 10, 2004, now abandoned, which was the National Stage of International Application No. PCT/JP03/01024, filed Jan. 31, 2003.

TECHNICAL FIELD

This invention relates to an electrolytic processing apparatus and a substrate processing apparatus provided with the electrolytic processing apparatus, and to a substrate processing method, and more particularly to an electrolytic processing apparatus useful for processing a conductive material present in a surface of a substrate, especially a semiconductor wafer, or for removing impurities adhering to a surface of a substrate, and a substrate processing apparatus and method for flattening a surface of a conductor (a conductive material) such as copper embedded in fine concave sections for wiring provided on a surface of a substrate such as a semiconductor wafer to form an embedded wiring thereon.

BACKGROUND ART

In recent years, instead of using aluminum or aluminum alloys as a material for forming interconnection circuits on a substrate such as a semiconductor wafer, there is a strong movement towards using copper (Cu) which has low electric resistance and high electromigration resistance. Copper interconnects are generally formed by filling copper into fine recesses formed in a surface of a substrate. There are known various techniques for forming such copper interconnects, including CVD, sputtering, and plating. According to any such technique, a copper film is formed on substantially an entire surface of a substrate, followed by removal of unnecessary copper by chemical mechanical polishing (CMP).

FIGS. 22(a) through 22(c) illustrate, in sequence of process steps, an example of forming such a substrate W having copper interconnects. As shown in FIG. 22(a), an insulating film 2, such as a silicon oxide film/a film of silicon oxide ($SiO_2$) or a film of low-k material, is deposited on a conductive layer 1a in which electronic apparatus are formed, which is formed on a semiconductor base 1. A contact hole 3 and a trench 4 for interconnects are formed in the insulating film 2 by performing lithography and an etching technique. Thereafter, a barrier layer 5 of TaN or the like is formed on an entire surface, and a seed layer 7 as an electric supply layer for electroplating is formed on the barrier layer 5.

Then, as shown in FIG. 22(b), copper plating is provided on a surface of substrate W to fill the contact hole 3 and the trench 4 with copper and, at the same time, deposit a copper film 6 on the insulating film 2. Thereafter, the copper film 6 on the insulating film 2 is removed by chemical mechanical polishing (CMP) so as to make a surface of the copper film 6, filled in the contact hole 3 and the trench 4 for interconnects, and a surface of the insulating film 2 lie substantially in the same plane. An interconnection composed of the copper film 6 as shown in FIG. 22(c) is thus formed.

Components in various types of equipment have recently become smaller, thereby requiring a high degree of accuracy. As sub-micro manufacturing technology has commonly been used, properties of materials are largely influenced by a processing method. Under these circumstances, in such a conventional processing method that a desired portion in a workpiece is physically destroyed and removed from a surface thereof by a tool, a large number of defects may be produced to deteriorate properties of the workpiece. It is important therefor to be able to perform processing without deteriorating properties of materials. Some processing methods, such as chemical polishing, electrolytic processing, and electrolytic polishing, have been developed in order to solve this problem. In contrast with conventional physical processing, these methods perform removal processing or the like through a chemical dissolution reaction. Therefore, they do not suffer from defects, such as formation of an altered layer and dislocation, due to plastic deformation, whereby processing can be performed without deteriorating properties of materials.

On the other hand, an electrolytic processing method and/or apparatus using an ion exchanger has been developed. In this method, as shown in FIG. 23, after an ion exchanger 512a mounted on a processing electrode 514 and an ion exchanger 512b mounted on a feeding electrode 516 are brought into contact with or close to a surface of a workpiece 510, liquid 518, e.g. ultrapure water, is supplied from a liquid supply section 519 between the processing electrode 514 and the feeding electrode 516, and the workpiece 510, while a voltage is applied from a power source 517 between the processing electrode 514 and the feeding electrode 16 to thereby perform a removing process of a surface of the workpiece. According to this electrolytic processing, water molecules 520 in the liquid 518 such as ultrapure water are dissociated by the ion exchangers 512a, 512b into hydroxide ions 522 and hydrogen ions 524. The hydroxide ions 522 thus produced, for example, are carried, by an electric field between the workpiece 510 and the processing electrode 514 and by flow of the liquid 518, to a surface of the workpiece 510 opposite to the processing electrode 514, whereby a density of the hydroxide ions 522 in the vicinity of the workpiece 510 is enhanced, and the hydroxide ions 522 are reacted with atoms 510a of the workpiece 510. A reaction product 526 produced by this reaction is dissolved in the liquid 518, and removed from the workpiece 510 by flow of the liquid 518 along a surface of the workpiece 510. A removing process of the surface of the workpiece 510 is thus effected.

As explained above, if an electrolytic process is performed by disposing an ion exchanger adjacent to at least one of a processing and feeding electrode and a workpiece, control at an end of processing becomes difficult.

Namely, when electrolytic processing is performed in a state where a current flowing between a processing electrode and a feeding electrode is controlled at a constant level, as a principle, a processing rate is kept constant unless an area to be processed changes, and because of this feature control during processing becomes easier, and in addition a totalized current value can be calculated easily, so that an amount of processing and a processing end point can easily be grasped. In association with progress of polishing, however, when barrier layer 5 comprising an insulating body (See FIG. 22(a)) is exposed on a surface of wafer W upon completion of electrolytic processing, an area to be processed decreases depending on a line/space ratio as well as on the wiring density, which may cause a rapid increase in a processing rate.

Further when a conductive film such as copper coating 6 (See FIG. 22(a) or FIG. 22(c)) as a material to be processed on a surface of the wafer W is removed, an electric resistance value of the conductive film becomes larger as a film thickness becomes smaller, and therefore when electrolytic processing is performed keeping a current at a constant level, a loaded voltage increases in association with reduction of film thickness, and an increasing rate becomes higher as a processing point comes closer to a processing end point where a wiring pattern is exposed on a surface of the wafer. This phenomenon occurs because applied voltage is inversely proportional to film thickness, and when voltage rapidly increases as described above, control over the processing end point is difficult. In addition, when the applied voltage increases over a predetermined value, dielectric breakdown (a so-called electric discharge) occurs in ultrapure water, which may cause physical damage to a workpiece.

On the other hand, when electrolytic processing is performed keeping a voltage applied to between a processing electrode and a feeding electrode at a constant level, a processing rate rapidly drops in association with rapid reduction of an area to be processed. Namely, in association with progress of polishing, when the barrier layer 5 comprising an insulating body (See FIG. 22(a) or FIG. 22(c)) is exposed on a surface of wafer W upon completion of processing, the area to be processed decreases, which makes it difficult for an electric current to flow therethrough, so that the processing rate rapidly drops, and thus the processing rate varies, so that it becomes difficult to detect a processing end point.

The processing end point means, as used herein, a point of time when processing has been performed up to a predetermined amount of processing for a specified section of an area to be processed, or for any parameter correlating to an integrated processing rate. As described above, by making it possible to freely set a processing end point even during processing, electrolytic processing in a multistage process is enabled.

Further, as described above, when it is attempted to remove copper used for coating substantially an entire surface of a substrate only by chemical-mechanical polishing (CMP), since a polishing liquid is generally used in the chemical-mechanical polishing, not only is it required to fully clean a semiconductor substrate contaminated by the polishing liquid after an end of polishing, but also there occur such problems as cost for the polishing liquid itself as well as for chemicals required for cleaning, and negative influences caused by this processing over an environment. Therefore, there is a strong need for alleviating disadvantages of CMP.

Although a process of polishing a wafer by CMP while plating is being performed has been reported, when mechanical processing is applied to a plating growth surface, sometimes abnormal growth of plating may be promoted, which may in turn cause abnormality in film quality. It has also been reported that, in electrolytic processing or in electrolytic polishing described above, processing proceeds in association with progress of an electro-chemical mutual reaction between a workpiece to be processed and an electrolytic solution (an aqueous solution of NaCl, $NaNO_3$, HF, HCl, $HNO_3$, NaOH or the like). Therefore, when the electrolytic solution containing an electrolyte as described above is used, a workpiece to be processed will inevitably be contaminated.

Further, an electrolytic processing method using an ion exchanger and deionized water, and preferably ultrapure water has been developed. Generally a plated substrate has fine irregularities on a surface (plated surface), and in this electrolytic processing method, deionized water is present also in concave sections of a substrate's surface, and as the deionized water itself is ionized little, a process for removing unnecessary materials from the substrate barely proceeds in sections contacting the deionized water in the concave sections. Therefore, a process for removing unnecessary materials proceeds only in sections contacting the ion exchanger containing abundant ions therein, and this method is advantageously more excellent in its capability for flattening a surface of a substrate as compared to a conventional electrolytic processing method using an electrolytic solution.

If an ion exchanger with low elasticity, namely a soft and easily-deformable ion exchanger is used, the ion exchanger follows irregularities on a surface of the substrate, and it is difficult to eliminate the irregularities on the substrate's surface by selectively processing convex sections thereon.

SUMMARY OF THE INVENTION

The present invention has been made in light of circumstances as described above, and it is an object of the present invention to provide an electrolytic processing apparatus having a relatively simple structure, and which makes it possible to detect a processing end point during electrolytic processing with high reliability.

Another object of the present invention is to provide a substrate processing apparatus and a substrate processing method which enable a work load to be reduced in chemical-mechanical polishing (CMP), and also enable processing insuring high flatness with high efficiency by replacing a part or all of a substrate processing step performed by using chemical-mechanical polishing (CMP) with electrolytic processing using deionized water, and preferably using ultrapure water.

The invention according to a first aspect provides an electrolytic processing apparatus comprising: an electrolytic processing section having a processing electrode and a feeding electrode, for electrolytically processing a surface of a workpiece in presence of a liquid by applying a voltage between the processing electrode and the feeding electrode; and a processing end point detecting section for detecting a processing end point by detecting a change in a frictional force generated between the workpiece and at least one of the processing electrode and the feeding electrode during this processing.

As a result of the configuration described above, it is possible to determine an amount of processing and detect a processing end point by detecting a change in a frictional force generated, for instance, when the workpiece contacts a different material due to a difference in friction coefficients between the workpiece and this material, or a change in the frictional force or any other factor generated when irregularities on a surface of the workpiece are removed for flattening. The change in the frictional force during processing can be detected by detecting a change in power provided as an input to a motor for rotating a top ring which holds and rotates a material to be processed such as a substrate, or for rotating a processing table.

The invention according to a second aspect provides an electrolytic processing apparatus comprising: an electrolytic processing section having a processing electrode and a feeding electrode, for electrolytically processing a surface of a workpiece in presence of a liquid by applying a voltage between the processing electrode and the feeding electrode; and a processing end point detecting section for detecting a processing end point by detecting a change in an amount of heat generated between the workpiece and at least one of the processing electrode and the feeding electrode during this processing.

In electrolytic processing generally, heat is generated by electric resistance of a surface of a workpiece, or because of collisions of ions with water molecules moving in a solution (deionized water) between a processing surface and a processed surface. Thus, when a copper coating deposited on a surface of a substrate is subjected to electrolytic processing under a constant voltage, as the electrolytic processing proceeds and a barrier layer or an insulating film is exposed, electric resistance becomes larger with a current value becoming smaller, so that an amount of heat generated gradually decreases. By using this characteristic, a processing end point can be detected by checking a change in an amount of generated heat to determine an integrated processing rate. A change in an amount of generated heat can be detected, for instance, by measuring a temperature of a workpiece such as a substrate or the like.

The invention according to a third aspect provides an electrolytic processing apparatus comprising an electrolytic processing section having a processing electrode and a feeding electrode, for electrolytically processing a surface of a workpiece in presence of a liquid by applying a voltage between the processing electrode and the feeding electrode; and a processing end point detecting section for detecting a processing end point by detecting a change in amplitude of light reflected from a processed surface of the workpiece.

By using this structure, it is possible to determine an amount of processing performed and to detect a processing end point by detecting a change in amplitude of reflected light, which is generated, for instance, when the workpiece is in contact with a different material due to a difference in reflectivity of these two materials.

The invention according to a fourth aspect provides an electrolytic processing apparatus comprising an electrolytic processing section having a processing electrode and a feeding electrode, for electrolytically processing a surface of a workpiece in presence of a liquid by applying a voltage between the processing electrode and the feeding electrode; and a processing end point detecting section for detecting a processing end point by detecting a change in an eddy current generated inside the workpiece during this processing.

When an eddy current is generated inside a conductive film such as a copper coating, an amplitude of the eddy current changes according to a thickness of the conductive film. Therefore, it is possible to determine an integrated (or total) processing rate and to detect a processing end point by monitoring the eddy current flowing inside the workpiece and detecting a change, for instance, in frequency.

The invention according to a fifth aspect provides an electrolytic processing apparatus comprising: an electrolytic processing section having a processing electrode and a feeding electrode, for electrolytically processing a surface of a workpiece in presence of a liquid by applying a voltage between the processing electrode and the feeding electrode; and a processing end point detecting section for detecting a processing end point by detecting and integrating a current flowing between the processing electrode and the feeding electrode during this processing.

In electrolytic processing, a total processing rate (processed amount) is determined by an amount of current flowing between a processing electrode and a feeding electrode, with the processing rate being proportional to an integrated (total) power consumption calculated by multiplying the amount of current by a processed time. Therefore, it is possible to determine an integrated (total) processing rate and detect a processing end point by integrating integrated power consumption calculated by multiplying a current value by a processing time and detecting a point of time when this integrated value reaches a predetermined value.

The invention according to a sixth aspect provides a substrate processing apparatus comprising: a chemical-mechanical polishing section for chemically and mechanically polishing a surface of a substrate; an electrolytic processing section having a processing electrode, a feeding electrode and an ion exchanger disposed at least either between the substrate and the processing electrode or between the substrate and the feeding electrode, and for electrolytically processing a surface of the substrate in presence of a liquid by applying a voltage between the feeding electrode and the processing electrode; and a top ring releasably holding the substrate and movable between the chemical-mechanical polishing section and the electrolytic processing section.

With this structure, it is possible to reduce a workload during a chemical-mechanical polishing step using a polishing liquid by sequentially executing two types of processing; one during chemical-mechanical polishing in the chemical-mechanical polishing section, and one during electrolytic processing (etching) in the electrolytic processing section. Polishing performed in the chemical-mechanical polishing section and electrolytic processing performed in the electrolytic processing section may be performed in any sequence and any number of times.

The invention according to a seventh aspect provides a substrate processing apparatus comprising: a chemical-mechanical polishing section for chemically and mechanically polishing a surface of a substrate; an electrolytic processing section having a feeding electrode and a processing electrode, for electrolytically processing a surface of the substrate in presence of deionized water or a liquid with an electric conductivity of at most 500 µS/cm between the substrate and each or at least one of the processing electrode and the feeding electrode, and applying a voltage between the feeding electrode and the processing electrode; and a top ring releasably holding the substrate and being freely movable between the chemical-mechanical polishing section and the electrolytic processing section.

It is preferable to use deionized water with electric conductivity of at most 10 µS/cm (as converted to 1 atm, 25µ, which is applicable also hereinafter), and is more preferable to use ultrapure water having an electric conductivity of at most 0.1 µS/cm. As described above, by performing electrolytic processing with deionized water, and preferably with ultrapure water, it is possible to process a surface of a workpiece cleanly without leaving any impurities, and also to simplify a cleaning step after the electrolytic processing.

When deionized water or preferably ultrapure water is used, each water molecule in the deionized water (ultrapure water) is dissociated to $OH^-$ and $H^+$ through a catalytic reaction with an ion exchanger, and for instance, generated $OH^-$ is removed to a processing electrode side along an electric field and through a flow of deionized water (ultrapure water), and an OH radical generated when an electric charge of the $OH^-$ ion is delivered to the processing electrode at a position close thereto is supplied to a workpiece, thereby enabling processing for removing unnecessary materials to be performed.

Further, it is possible to use an electrolytic solution with electric conductivity of at most 500 µS/cm, preferably of at most 50 µS/cm, and more preferably of at most 0.1 µS/cm prepared by adding an additive such as a surface active agent to the deionized or ultrapure water. A solution of, for instance, a neutral salt of NaCl or $Na_2SO_4$, an acid such as HCl or $H_2SO_4$, or an alkali such as ammonia may be used as the electrolytic solution by selecting any of those described above at need.

The invention according to an eighth aspect provides a substrate processing apparatus comprising: a chemical-mechanical polishing section for chemically and mechanically polishing a surface of a substrate; an electrolytic processing section having a processing electrode, a feeding electrode and an ion exchanger disposed at least either between the substrate and the processing electrode or between the substrate and the feeding electrode, for electrolytically processing the surface of the substrate in presence of a liquid by applying a voltage between the feeding electrode and the processing electrode; one or more top rings for releasably holding the substrate; and a pusher located between the chemical-mechanical polishing section and the electrolytic processing section for transferring the substrate between the chemical-mechanical polishing section and the electrolytic processing section.

With this structure, by delivering or receiving a substrate with the pusher, chemical-mechanical polishing in the chemical-mechanical polishing section and electrolytic processing (etching) in the electrolytic processing section can sequentially be performed.

The invention according to a ninth aspect provides a substrate processing apparatus comprising a chemical-mechanical polishing section for chemically and mechanically polishing a surface of a substrate; an electrolytic processing section having a feeding electrode and a processing electrode, for electrolytically processing the surface of the substrate in presence of deionized water or a liquid with an electric conductivity of at most 500 μS/cm between the substrate and the processing electrode or between the substrate and the feeding electrode; one or more top rings for releasably holding the substrate; and a pusher located between the chemical-mechanical polishing section and the electrolytic processing section and for transferring the substrate between the chemical-mechanical polishing section and the electrolytic processing section.

The invention according to a tenth aspect provides a substrate processing apparatus according to any one of the sixth to ninth aspects, wherein the chemical-mechanical polishing section performs a chemical-mechanical polishing using a fixed abrasive member.

As described above, by using a fixed abrasive member and performing chemical-mechanical polishing with a solution prepared by adding an additive such as a surface active agent to deionized water or ultrapure water not containing an abrasive member therein, an amount of use of a polishing solution which is troublesome to use and expensive can be reduced.

The invention according to an eleventh aspect provides a substrate processing apparatus according to any one of the sixth to ninth aspects, wherein an anti-oxidant is added in the liquid used in the electrolytic processing section.

The invention according to a twelfth aspect provides a substrate processing apparatus according to any one of the six to eleventh aspects, wherein a plurality of polishing tables are provided in the chemical-mechanical polishing section.

The invention according to a thirteenth aspect provides a method for processing a substrate using three or more process stages comprising: polishing a surface of the substrate by chemical-mechanical polishing; and removing unnecessary portions from the surface of the substrate by electrolytic processing using deionized water or ultrapure water or a liquid with an electric conductivity of at most 500 μS/cm.

In electrolytic processing, when a value of a current supplied to between a feeding electrode and a processing electrode is large, a processing rate becomes larger (when this current value is small, the processing rate is smaller). On the other hand, when a voltage between the feeding electrode and the processing electrode is high, a value of the current flowing between the processing electrode and the feeding electrode becomes larger, and as a result the processing rate (processed amount) becomes larger. Therefore, it is possible to adjust the processing rate to an optimal value by freely changing (for instance, from time to time) at least one of voltage or current between the processing electrode and the feeding electrode according to a processing stage (or situation).

Further, by concurrently executing a conventional type of chemical-mechanical polishing (CMP) and electrolytic processing with deionized water, a solution with an electric conductivity of at most 500 μS/cm, or an electrolytic solution, a workload in the chemical-mechanical polishing can be reduced. Further, chemical-mechanical polishing and etching by virtue of electrolytic processing may be performed in any order and any amount of times.

The invention according to a fourteenth aspect provides a method for processing a substrate using three or more process stages comprising: polishing a surface of the substrate by chemical-mechanical polishing; and removing unnecessary portions of the substrate by electrolytic processing by placing an ion exchanger at least either between the substrate and a processing electrode or between the substrate and a feeding electrode, and applying a voltage between the feeding electrode and the processing electrode in presence of deionized water, a liquid with an electric conductivity of at most 500 μS/cm, or an electrolytic solution.

The invention according to a fifteenth aspect is a method for processing a substrate comprising: polishing a surface of the substrate by chemical-mechanical polishing using a fixed abrasive member; and removing unnecessary portions of the substrate with deionized water or ultrapure water or a liquid with an electric conductivity of at most 500 μS/cm.

Using this method, it is possible, for instance, to remove a copper layer formed on a surface of a substrate by performing chemical-mechanical polishing and electrolytic processing and, when a barrier metal (a barrier layer) comprising, for instance, TaN, is exposed, by removing the barrier metal by chemical-mechanical polishing.

The invention according to a sixteenth aspect provides a substrate processing apparatus comprising: a plurality of electrolytic processing sections, each of the electrolytic processing sections having a feeding electrode and a processing electrode, for electrolytically processing a surface of a substrate by supplying a fluid to at least either between the substrate and the processing electrode or between the substrate and the feeding electrode and supplying a voltage to between the feeding electrode, and the processing electrode. As a result of this feature, it is possible to perform electrolytic processing using different processing characteristics with ion exchangers having different characteristics or belonging to a different type in a plurality of electrolytic processing sections.

The invention according to a seventeenth aspect provides a substrate processing apparatus according to the sixteenth aspect, wherein an ion exchanger is provided at least either between the substrate and the processing electrode or between the substrate and the feeding electrode in at least one of the plurality of electrolytic processing sections.

The invention according to an eighteenth aspect provides a substrate processing apparatus according to the sixteenth aspect, wherein an ion exchanger is provided at least either between the substrate and the processing electrode or between the substrate and the feeding electrode in all of the plurality of electrolytic processing sections.

The invention according to a nineteenth aspect provides a substrate processing apparatus according to the seventeenth or eighteenth aspect comprising: a plurality of electrolytic processing sections with different types of ion exchangers, respectively. Because of this feature, for instance, polishing for eliminating steps on a surface of a substrate can be performed in an electrolytic processing section using an ion exchanger with high elasticity, and then polishing for removing unnecessary portions of the substrate can be performed, after the steps have been removed, in an electrolytic processing section using an ion exchanger with low elasticity.

The invention of a twentieth aspect provides a substrate processing apparatus according to any one of the sixteenth to nineteenth aspects further comprising: a chemical-mechanical polishing section for chemically and mechanically polishing a surface of a substrate.

As a result of this feature, it is possible to efficiently perform processing requiring different processing conditions from those required in the electrolytic processing section for removing, for instance, a barrier metal (a barrier layer). The barrier metal can be processed and removed by chemical-mechanical polishing (CMP) using a polishing pad and slurry.

The invention according to a twenty-first aspect provides a substrate processing apparatus comprising: an ion exchanger holding member for holding an ion exchanger; an electrolytic processing section having a processing electrode, a feeding electrode and an ion exchanger disposed at least either between the substrate and the processing electrode or between the substrate and the feeding electrode, for electrolytically processing a surface of the substrate in presence of a liquid by applying a voltage between the feeding electrode and the processing electrode; and an ion exchanger replacement device for replacing the ion exchanger holding member in the electrolytic processing section with another ion exchanger holding member.

As a result of the features described above, by exchanging an ion exchanger in the electrolytic processing section with another one via, for instance, a cartridge type of ion exchanger holding member for holding an ion exchanger, it is possible to perform different types of electrolytic processing under different conditions in a single electrolytic processing section.

The invention according to a twenty-second aspect provides a substrate processing apparatus according to the twenty-first aspect, wherein the electrolytic processing section has a plurality of ion exchanger holding members.

The invention according to a twenty-third aspect provides a substrate processing method for electrolytically processing a surface of a substrate through a multi-stage process in presence of a liquid, an ion exchanger at least between a substrate and a processing electrode or between the substrate and a feeding electrode, and a voltage applied between the processing electrode and the feeding electrode, the method comprising: electrolytically processing the substrate using a first ion exchanger; and electrolytically processing the substrate using a second ion exchanger, wherein the first ion exchanger has higher elasticity than that of the second ion exchanger.

The invention according to a twenty-fourth aspect provides a substrate processing method for removing unnecessary portions of a surface of a substrate by using a plurality of steps of performing electrolytic processing by: placing an ion exchanger at least between the substrate and a processing electrode or between the substrate and a feeding electrode, applying a voltage between the processing electrode and the feeding electrode, and causing relative movement between the substrate and at least one of the processing electrode and the feeding electrode in presence of a ultrapure water, deionized water or a fluid with an electric conductivity of at most 500 μS/cm; performing electrolytic processing by applying a voltage between the processing electrode and the feeding electrode and also causing relative movement between the substrate and at least one of the processing electrode and the feeding electrode in presence of an electrolytic solution; and performing polishing by chemical-mechanical polishing.

The invention according to a twenty-fifth aspect provides the substrate processing method as described in the twenty-fourth aspect further comprising: removing conductive materials on the surface of the substrate by electrolytic processing using an ion exchanger; and removing a barrier layer on the surface of the substrate by either electrolytic processing with an electrolytic solution or chemical-mechanical polishing.

The invention according to a twenty-sixth aspect provides a substrate processing method comprising: removing conductive materials on a surface of a substrate by electrolytic processing using a first ion exchanger; and removing a barrier layer on the surface of the substrate by electrolytic processing using a second ion exchanger which is other than the first ion exchanger, an electrolytic solution, chemical-mechanical polishing, or a combination thereof.

The invention according to a twenty-seventh aspect provides a substrate processing method according to the twenty-fifth or twenty-sixth aspect, wherein the conductive material is copper.

The invention according to the present invention provides the substrate processing method according to any one of the twenty-fifth to twenty-seventh aspects, wherein the barrier layer is made of any of TaN, Ta, TiN, and WN.

The disclosure by the application of PCT/JP02/01545 "ELECTROLYTIC PROCESSING DEVICE AND SUBSTRATE PROCESSING APPARATUS" is incorporated herein by reference.

DETAILED DESCRIPTION OF THE PREFERRED EMBODIMENTS

Embodiments of the present invention are described below with reference to the drawings. It should be noted that, although the example shown in FIG. 22B is a case where wiring comprising a copper coating 6 is formed as shown in FIG. 22C, by removing the copper coating 6 and a barrier metal deposited on an insulating film 2 to align a surface of the copper coating filled in a contact hole 3 as well as in a groove 4 for wiring with a surface of the insulating film 2 almost on the same plane, the present invention can be applied to a coating made of a material other than copper.

Figure 1:
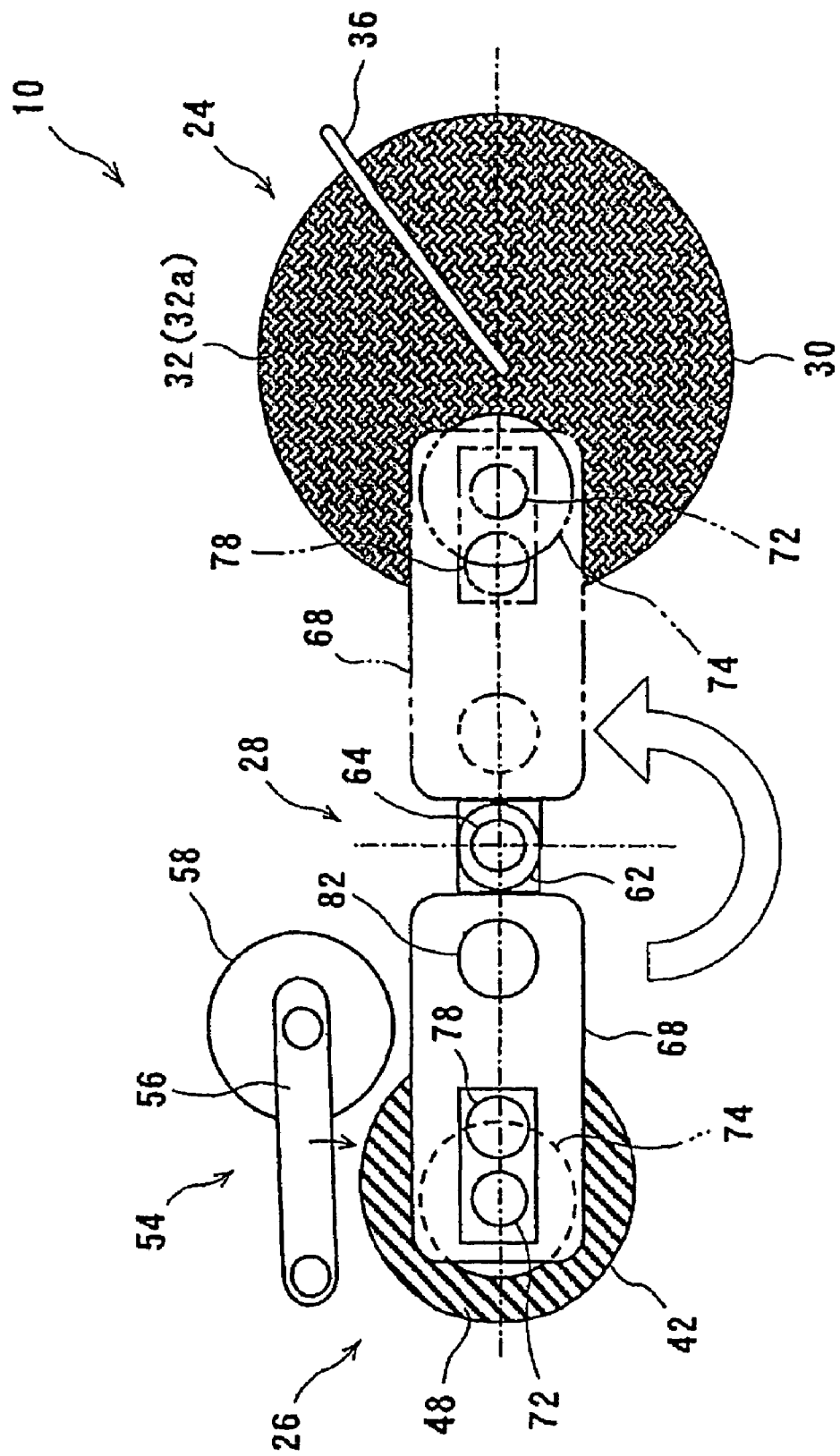
FIG. 1 is a flat view showing a substrate processing apparatus according to a first embodiment of the present invention.
Figure 2:
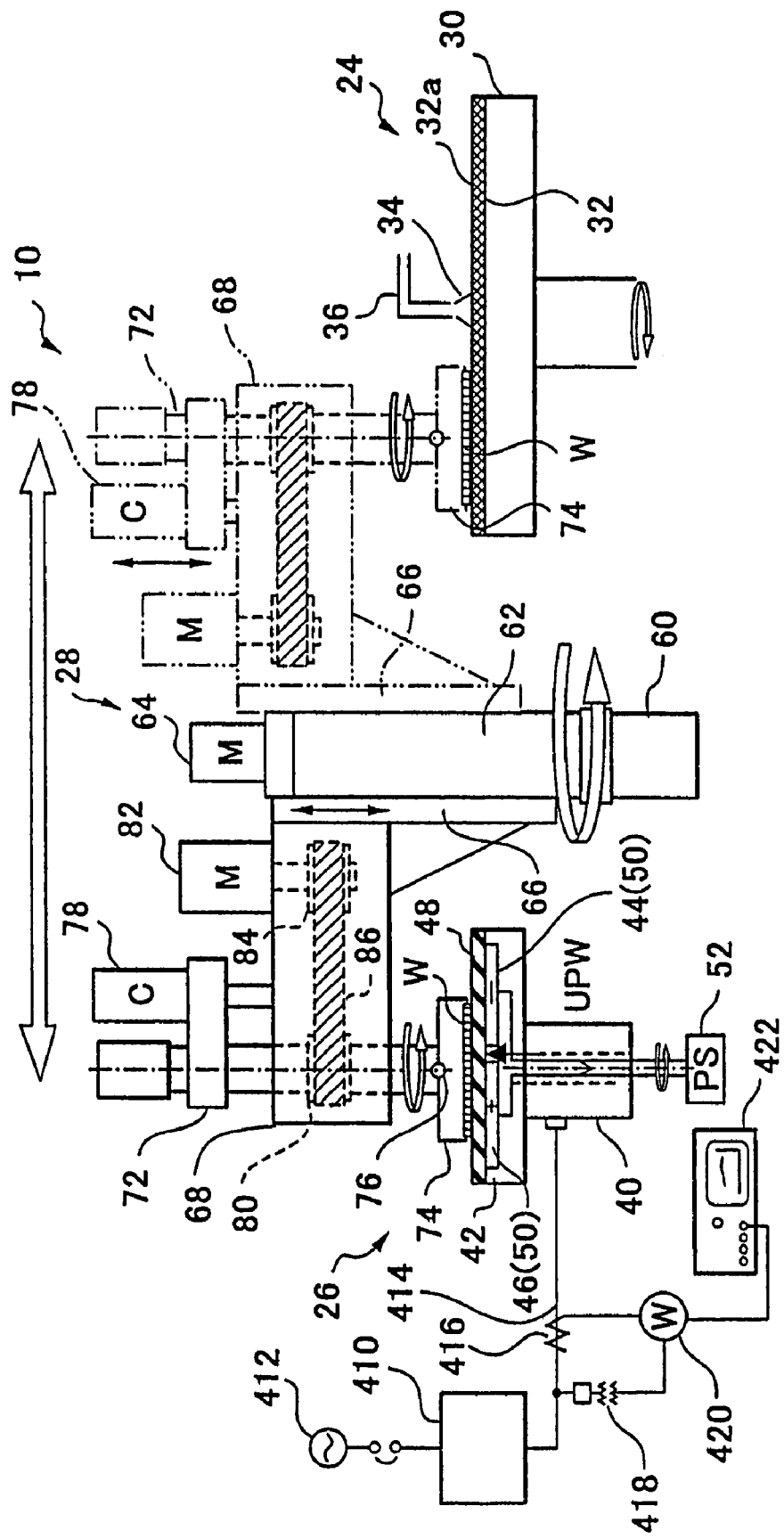
FIG. 2 is a front view showing the substrate processing apparatus according to the first embodiment of the present invention.
Figure 3:
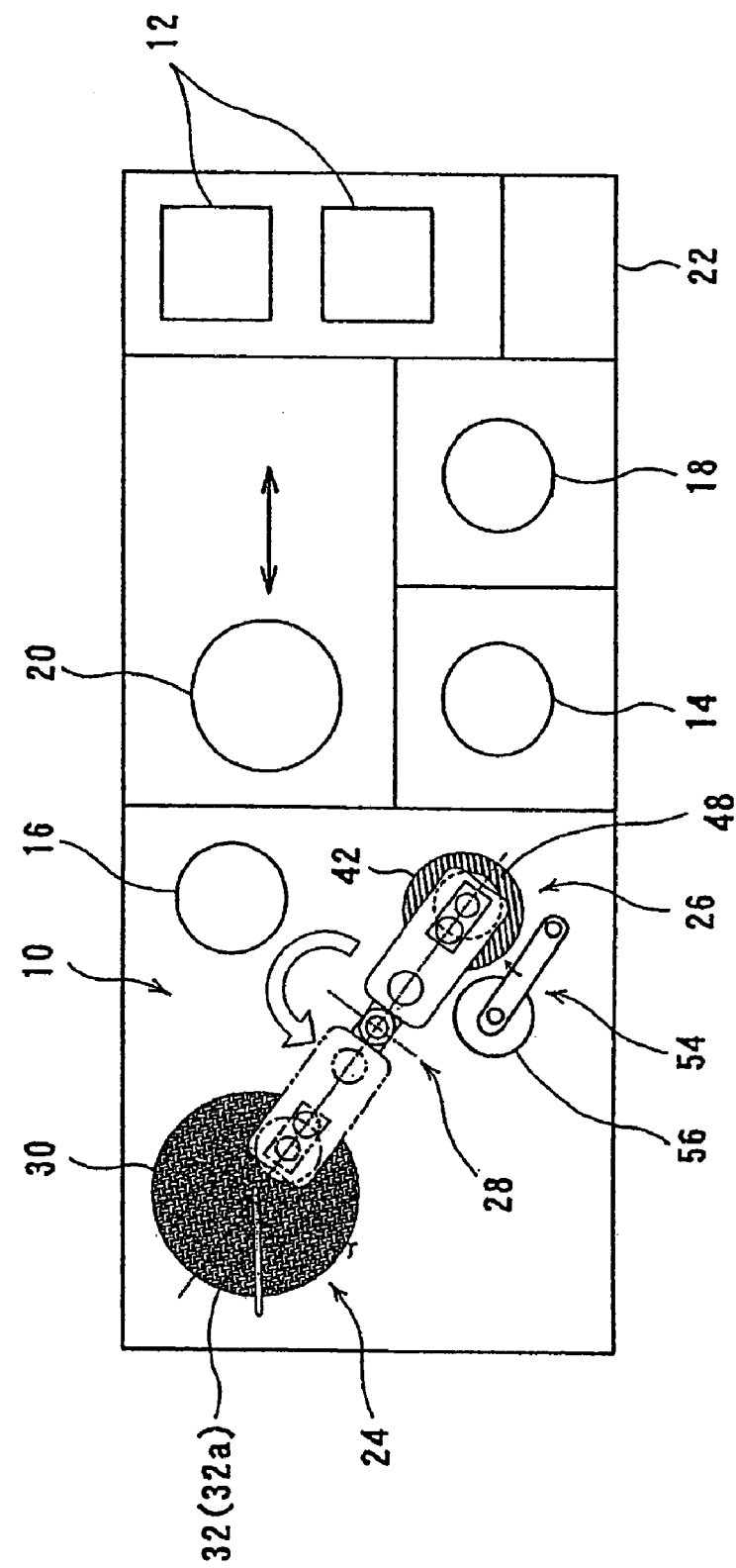
FIG. 3 is a block diagram showing an entire configuration of a substrate processing system equipped with the substrate processing apparatus shown in FIG. 1 and FIG. 2.

FIG. 1 and FIG. 2 show a substrate processing apparatus having an electrolytic processing apparatus according to a first embodiment of the present invention, and a chemical-mechanical polishing apparatus, and FIG. 3 shows an entire configuration of a substrate processing system having substrate processing apparatus 10. As shown in FIG. 3, the substrate processing system comprises: a pair of load/unload sections 12 as a carrying in/out section for carrying in or out a cassette with a substrate W having copper coating 6 as a conductive coating (a workpiece) on a surface thereof; a reversing unit 14 for reversing the substrate W; a pusher 16 for receiving or delivering a substrate; a cleaning apparatus 18; and a substrate processing apparatus 10. Further provided at a position surrounded by the load/unload sections 12, the reversing unit 14, pusher 16, and cleaning device 18 is a running type of carrier robot. Further there is provided a control section 22 for providing various types of controls for controlling a voltage applied to between a processing electrode 44 and a feeding electrode 46 each described below, or a current flowing between the processing electrode and the feeding electrode when electrolytic processing is performed by the substrate processing apparatus 10.

As shown in FIG. 1 and FIG. 2, the substrate processing apparatus 10 comprises: a chemical-mechanical polishing section 24 for chemically and mechanically polishing a surface of a substrate; an electrolytic processing section 26 for etching a surface of a substrate by performance of electrolytic processing with ultrapure water or deionized water; and a carrier section 28 for removably holding a substrate and carrying the substrate between the chemical-mechanical polishing section 24 and the electrolytic processing section 26, with the chemical-mechanical polishing device 24 and the carrier section 28 forming a CMP device, and the electrolytic processing section 26 and the carrier section 28 forming an electrolytic processing device. Namely, the carrier section 28 functions as a carrier section for both the electrolytic processing device and the CMP device.

The chemical-mechanical polishing section 24 comprises a rotatable polishing table 30 and polishing pad 32 adhered to a top surface of this polishing table 30, and an abrasive solution nozzle 36 for supplying an abrasive solution (a polishing solution) 34 to the polishing pad 32 is provided above the polishing table 30. Commercially available polishing pad 32 includes, for instance, SUBA 800, and IC-1000 or the like manufactured by Rodel Corp. In chemical-mechanical polishing, a substrate is made flat using an abrasive coating. Between the polishing table 30 and the substrate W, it is required that relative movement be possible, while such movements as rotation, scrolling (translational rotation), and reciprocal linear movement are allowable for the polishing table 30.

The electrolytic processing section 26 has a processing table 42 which can perform such movements as orbital motion, and so-called scrolling (translational rotation). This processing table is made of an insulating material, and processing electrodes 44 and feeding electrodes 46 each having a fan-like shape are alternately embedded on a top surface of this processing table 42 along a periphery, and ion exchangers are placed on the processing electrodes 44 and the feeding electrodes 46. Further provided inside a hollow motor 40 is a deionized water feed pipe (not shown) extending from outside, and a through-hole opened on a top surface of the processing table 42 and communicating with this deionized water feed pipe is provided at a center of the processing table 42. Because of this configuration, deionized or preferably ultrapure water is supplied through the deionized water feed pipe and the through-hole to ion exchanger 48 placed on the processing table 42.

Herein, the deionized water is water with electric conductivity of, for instance, at most 10 μS/cm (as converted to 1 atm, 25μ, which is applicable also hereinafter), while the ultrapure water is water with an electric conductivity of 0.1 μS/cm. It should be noted that a liquid with an electric conductivity of at most 500 μS/cm, any type of electrolytic water, and an anti-oxidant (such as BAT; benzotriazole) may be added in place of the deionized water or preferably in place of the ultrapure water. By supplying an electrolytic solution and/or adding an anti-oxidant (such as, for instance, benzotriazole (BTA)) during processing, instability in processing due to products generated during processing or generation of a gas can be removed, so that homogeneous processing with excellent reproducibility can be realized. The BTA forms a thin film on a surface of various types of metals. In electrolytic processing according to the present invention, a formed coating can be removed by virtue of a scrub effect of the ion exchanger, so that a surface of a metal with no exposed oxide film being formed thereon can be contacted with a processing electrode or an ion exchanger on the processing electrode.

In this example, a plurality of electrode plates 50 each having a form like a fan is arranged on a top surface of the processing table 42 along the periphery, and when a cathode and an anode of a power supply unit 52 are alternately connected to the electrode plates 50, the electrode plates 50 connected to the cathode of the power supply unit 52 function as processing electrodes 44 respectively, while the electrode plates 50 connected to the anode function as feeding electrodes 46 respectively. This effect can be achieved because, for instance, in case of copper, an electrolytic processing effect occurs on a cathode side, and in some types of materials to be processed, a configuration is allowable in which the cathode side functions as a feeding electrode and the anode side functions as a processing electrode. Namely, when the material to be processed is, for instance, copper, molybdenum, or iron, the electrolytic processing effect occurs at the cathode side, so that a configuration is possible in which the electrode plates 50 connected to the cathode of the power supply unit 52 function as processing electrodes and the electrode plates 50 connected to the anode function as the feeding electrodes 46, respectively. On the other hand, when the material to be processed is aluminum or silicon, the electrolytic processing effect occurs on an anode side, so that the electrodes connected to the anode of the power supply unit function as processing electrodes and those connected to the cathode function as feeding electrodes, respectively.

The ion exchanger 48 comprises, for instance, a non-woven cloth with an anion exchange function or a cation exchange function given thereto. A cation exchanger preferably carries a strongly acidic group (such as a sulfonic group) thereon, but may carry a weakly acidic group (such as a carboxylic group) thereon. An anion exchanger preferably carries an anion exchanging group comprising a strongly acidic group (a quarternary group), but may carry an anion exchanging group comprising a weakly acidic group (a tertiary or lower grade amino group).

The non-woven cloth, for instance, with a strongly acidic group anion exchanging function given thereto is prepared by introducing a graft chain by performance of the so-called "radioactive ray graft polymerization method", in which graft polymerization is performed after irradiation of γ rays, into a non-woven cloth made of polyolefin with a textile diameter from 20 to 50 μm and with a void ratio of about 90%, and then aminating this introduced graft chain to introduce an quarternary ammonium group. A quantity of introduced ion exchanging groups is decided according to a quantity of graft chains to be introduced. For performing graft polymerization, a monomer of such materials as acrylic acid, styrene, glycidyl methacrylate, sodium styrene sulfonate, and chloromethyl styrene may be used, and a quantity of graft chains used for polymerization can be controlled by controlling a concentration of the monomer, a reaction temperature, and a reaction time. A ratio of the material of weight after the graft polymerization against the weight after the graft polymerization is called a graft ratio, and a graft ratio up to 500% is allowable, and a maximum quantity of ion exchanging groups introduced after this graft polymerization up to 5 meq/g is allowable.

A non-woven cloth with a strongly acidic cation exchanging function imparted thereto is prepared, as in the method of imparting the strongly acidic group anion exchanging function, by introducing a graft chain by performance of the so-called "radioactive ray graft polymerization method", in which graft polymerization is performed after irradiation of γ rays, into a non-woven cloth made of polyolefin with a textile diameter from 20 to 50 μm and with a void ratio of about 90%, and then processing this introduced graft chain, for instance, with hot sulfuric acid to introduce a sulfonic acid group therein. When the introduced graft chain is processed with hot phosphoric acid, a phosphoric acid group can be introduced. Herein, this graft ratio is allowable up to 500%, and a maximum quantity of ion exchanging groups introduced after this graft polymerization is allowable up to 5 meq/g.

As a material for the ion exchanger 48, a polyolefin-based polymer such as polyethylene, polypropylene, or other organic high polymer may be used. Forms of the ion exchanger 48 may include, in addition to a non-woven cloth, a woven cloth, a sheet, a porous material, a net, and a short fiber.

A raw material made of polyethylene or polypropylene can be at first radical-polymerized by irradiating (pre-irradiation) radioactive rays (γ rays and an electron beam) to the material, and then can be graft-polymerized by reacting the material with monomers. With this processing, a homogenous graft chain with few impurities can be produced. On the other hand, other organic high polymer materials can be radical-polymerized by at first impregnating monomers thereto and then irradiating radioactive rays (γ rays, an electron beam, and ultraviolet rays) (simultaneously). This method may be applied to almost all materials, although homogeneity in a final product is slightly lower as compared to that produced when polyethylene or polypropylene is used.

By forming the ion exchanger 48 with non-woven cloth with the anion exchanging function or cation exchanging function assigned thereto as described above, it becomes possible for a solution such as deionized water, ultrapure water, or an electrolytic solution to freely move inside the non-woven cloth and easily reach a degree of activity where a catalytic action for dissociating water inside the non-woven cloth is realized, so that many water molecules are dissociated into hydrogen ions and hydroxide ions. Further, the hydroxide ions are efficiently carried to a surface of processing electrode 44 in association with movement of the solution such as deionized water, ultrapure water, and the electrolytic solution generated in dissociation, so that a large current can be obtained even with a low voltage applied thereto.

Further, as shown in FIG. 1, a regenerating section 54 for regenerating the ion exchanger 48 is provided at a side of the processing table 42. This regenerating section 54 comprises an oscillating arm 56, and a regeneration head 58 held at a free edge of this oscillating arm 56. The ion exchanger 48 can be regenerated during processing by applying a voltage, reverse to that applied during processing, to the ion exchanger 48 from the power supply unit 52 (See FIG. 2) for promoting dissolution of materials such as copper deposited on the ion exchanger 48. In this case, regenerated ion exchanger 48 is rinsed with deionized water or ultrapure water supplied to a top surface of the processing table 42.

The hollow motor 40 is connected to an inverter 410 as shown in FIG. 2, and AD power converted to that having a desired frequency and a desired voltage is supplied from a utility AD power source 412 via a connection table 414 to the hollow motor 40. The processing table 42 rotates at a rotating speed suited to predetermined conditions for electrolytic processing. A current converter 416 and a voltage converter 418 are connected to the connection table 414, and output from these converters is provided as input to a power meter 420. Input power to the hollow motor 40 detected by the power meter 420 is reported to a signal processor 422, which is a processing end point detecting section, and this signal processor 422 determines whether or not a change in the input power into the hollow motor 40 is larger than a predetermined value. Namely, the input power to the hollow motor 40 changes in association with a change in a frictional force generated between the substrate W and processing electrode 44 or feeding electrode 46, and therefore by detecting a change in the input power into the hollow motor 40, a change in frictional force between the substrate W and the processing electrode 44 and between the substrate W and the feeding electrode 46 is detected to determine an integrated processing rate for detecting a processing end point.

Although the above description assumes a case where power supplied to the hollow motor 40 for driving and rotating the processing table 42 is detected, an alternate is allowable in which power supplied to a top ring rotation motor 82 for driving and rotating top ring 74 is detected.

The carrier section 28 is placed between the chemical-mechanical polishing section 24 and the electrolytic processing section 26 and has a pivot shaft 62 which rotates when driven by swivel motor 60 attached at a lower end thereof. This pivot shaft 62 is equipped with an elevating board 66 which moves vertically in an axial direction in accordance with movement of the elevating motor 64 attached to an upper end thereof. A base edge section of top ring head 68 extending in a horizontal direction is fixed to the elevating board 66. Provided at a free end of this top ring head 68 is an elevating shaft 72, and to a lower edge of this elevating shaft 72 is linked the top ring 74 for detachably holding a substrate W via a ball joint 76 in such a manner as to allow free tilting.

In parallel with the elevating shaft 72, a cylinder 78 is set which presses the substrate W held by the top ring 74 via the elevating shaft 72 toward polishing surface 32a on the polishing table 30 with a predefined pressure. Further, a timing belt 86 is provided to bridge driven pulley 80 which is attached to the shaft 72 and driving pulley 84 which is fixed to a driving shaft of the top ring swivel motor 82, thereby enabling the top ring 74 to rotate monolithically with the elevating shaft 72 in accordance with rotation of the motor 82.

By this movement, the top ring head 68 is oscillated to move the top ring 74 toward directly above the pusher 16 shown in FIG. 3 for raising the pusher 16, and receives the substrate W from the pusher 16. Then, in a state where the substrate W is held by the top ring 74, the top ring head 68 is oscillated to make the top ring 74 move toward a position above the polishing table 30. Subsequently, the top ring 74 is caused to descend and the substrate W held by the top ring 74 via the cylinder 78 is pressed under a predetermined pressure toward the polishing surface 32a on the polishing table 30 and at the same time the polishing table 30 and the top ring 74 are rotated to supply an abrasive solution from the abrasive solution nozzle 36 to the polishing pad 32. With operations described above, chemical-mechanical polishing of a surface (undersurface) of the substrate W is performed.

Further in the state where the substrate W is held by the top ring 74, the top ring head 68 is oscillated and the top ring 74 is moved to a position above the processing table 42. Then, the top ring 74 is descended to move the substrate W held by the top ring 74 to a position close to or in direct contact with the ion exchanger 48 on the processing table 42. Under this condition, both the processing table 42 and the top ring 74 are rotated to supply deionized water or preferably ultrapure water to the ion exchanger 48 on the upper surface of the processing table 42, and concurrently a voltage is applied to between the processing electrodes 44 and the feeding electrodes 46. By this process, electrolytic processing (etching) of a top surface (or undersurface) of the substrate is performed.

Next, processing (electrolytic processing) of a substrate by this substrate processing system is described below. The example described below assumes a case where, for instance, when a barrier metal (barrier layer) 5 comprising TaN is exposed, the barrier metal 5 is chemically and mechanically removed by chemically-mechanically polishing a surface of a substrate W held by the top ring 74, and then performed is electrolytically processing of the surface for etching, and further chemically-mechanically polishing of the surface is performed to remove copper coating 6 formed on the surface of the substrate W by virtue of a combination of the chemical-mechanical polishing and electrolytic processing. It is needless to that that the chemical-mechanical polishing and the electrolytic processing may be performed in any sequence and any number of times.

At first, as shown in FIG. 22(b), a sheet of substrate W is taken out from a cassette, by the carrier robot 20, accommodating therein the substrate W with a copper coating (conductive material) 6 formed as a conductive film (a section to be processed) shown in FIG. 22(b) and set on load/unload section 12, and the substrate W is transferred to the reversing machine 14 to be reversed therein so that a top surface of the substrate W with the copper coating 6 formed thereon faces downward. Then the substrate W with this surface facing downward is carried to the pusher 16 by the carrier robot 20 to be placed on the pusher 16. Then, the top ring head 68 is pivoted to move the top ring 74 to a position directly above the pusher 16, and in that state the pusher 16 is raised and the substrate W on the pusher 16 is sucked and held by the top ring 74.

Next, in a state where the substrate W is held by the top ring 74, the top ring 74 is moved to a position above the polishing table 30 by pivoting the top ring head 68. Then, the top ring 74 is caused to descend, and the substrate W held by the top ring 74 is pressed to the polishing surface 32a on the polishing table 30 via the cylinder 78 under a predetermined force. In this state, the polishing table 30 and the top ring 74 are rotated, and at the same time, an abrasive solution is supplied from the abrasive solution nozzle 36 to the polishing pad 32 and chemical-mechanical polishing is performed for an undersurface of the substrate W. When a thickness of the copper film 6 is detected to have reached a desired level, the top ring 74 is raised with rotation of the polishing table 30 and the top ring 74 stopped, and further supply of the abrasive solution is stopped; thus the chemical-mechanical polishing being terminated.

Then, in the state where the top ring 74 is holding the substrate W, the top ring head 68 is pivoted to move the top ring 74 to a position above the processing table 42. After this operation, the top ring 74 is caused to descend to move the substrate W held by the top ring 74 to a position extremely close to or directly in contact with the ion exchanger 48 on the processing table 42, and in this state, the processing table 42 and the top ring 74 are rotated, and at the same time, deionized water or preferably ultrapure water is supplied to the ion exchanger 48 on the top surface of the processing table 42; thus, electrolytic processing (etching) being performed to a top surface (undersurface) of the substrate W by applying a voltage to between the processing electrodes 44 and the feeding electrodes 46.

In brief, by actions of hydrogen ions or hydroxide ions generated by the ion exchanger 48, electrolytic processing of the copper coating 6 formed on the substrate W is performed, and efficient electrolytic processing can be performed by enabling deionized water or preferably ultrapure water to smoothly flow through the ion exchanger 48 to generate a large amount of hydrogen ions and hydroxide ions, and supplying these ions to a surface of the substrate W.

In this process, a processing efficiency can be improved by making deionized water, or preferably ultrapure water freely flow through inside of the ion exchanger 48 to sufficiently supply water to functional groups (or sulfonic groups in a case of a strongly acidic cation exchanger material) capable of promoting dissociation of water molecules and removing processing products (including gas) generated through a reaction with hydroxide ions (or OH radicals) with flow of the water. Therefore, the flow of the deionized, or more preferably the ultrapure water is required and the flow of the deionized or more preferably the ultrapure water should preferably be constant and even for achieving uniformity and homogeneity in ion supply, removal of processing products as well as in processing efficiency.

In this step, a voltage applied to or current flowing between the processing electrodes 44 and the feeding electrodes 46 is controlled in the control section 22 to adjust a processing rate to an optimal value, and when, for example, exposure of barrier metal 5 comprising TaN or the like is detected, the electrolytic processing is finished. Generally, when the voltage applied to between the processing electrodes 44 and the feeding electrodes 46 is high, a value of a current flowing between the processing electrodes 44 and the feeding electrodes 46 becomes larger, and as a result also the processing rate (processed amount) becomes higher. Therefore, it is possible to adjust the processing rate to an optimal value by varying (for example from time to time) at least either one of the voltage or the current applied between the processing electrodes 44 and the feeding electrodes 46.

At the same time, power into the hollow motor 40 is detected with the power meter 420, and whether or not a power variation is kept within a predetermined range is determined by the signal processor 422, and thereby determined is the fact that the barrier layer 5 comprising TaN or the like has been exposed to a top surface of the substrate W, when a processing end position is detected. Namely, when the barrier layer 5 comprising TaN or the like has been exposed on a top surface of the substrate W, a frictional force generated between the substrate W and processing electrode 44 or between the substrate W and feeding electrode 46 begins to change, and also input power to the hollow motor 40 is changed. By detecting this change in the input power to the hollow motor 40, it is determined that the barrier layer 5 comprising TaN or the like has been exposed on a surface of the substrate W, and this point is regarded as a processing end point. After completion of electrolytic processing, power supply is disconnected with the top ring 74 raised upward, and rotation of the processing table 42 and the top ring 74 is stopped.

Next, in the state where the substrate W is held by the top ring 74, the top ring head 68 is pivoted as described above to move the top ring 74 to a position above the polishing table 30, and then the substrate W being held by the top ring 74 is pressed with a prescribed pressure to the polishing surface 32*a* of the polishing table 30 and the polishing table 30 and the top ring 74 are concurrently rotated with abrasive solution supplied to the polishing pad 32 from the abrasive solution nozzle 36; thus, a top surface (or undersurface) of the substrate W being chemically-mechanically polished.

Figure 22A:
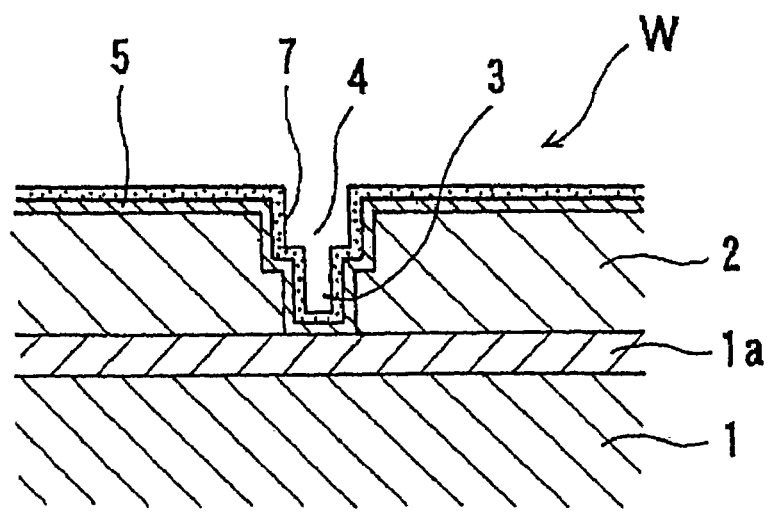
FIG. 22(a) to FIG. 22(c) are views each showing a step of forming copper wiring in a sequential order, respectively.
Figure 22B:
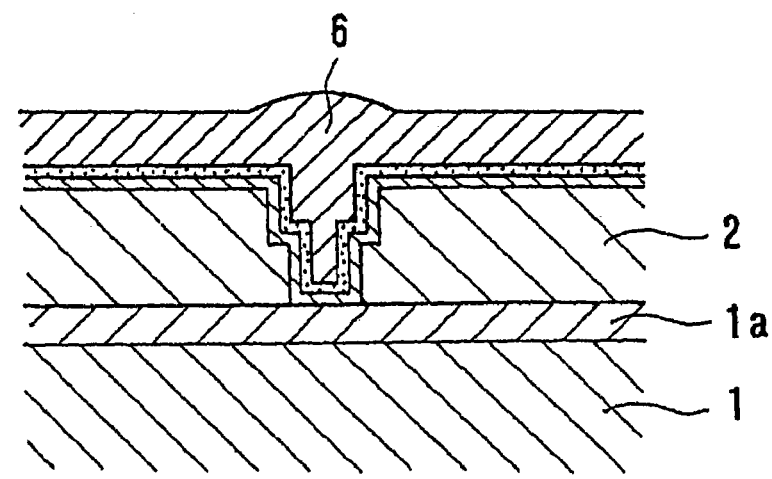
Figure 22C:
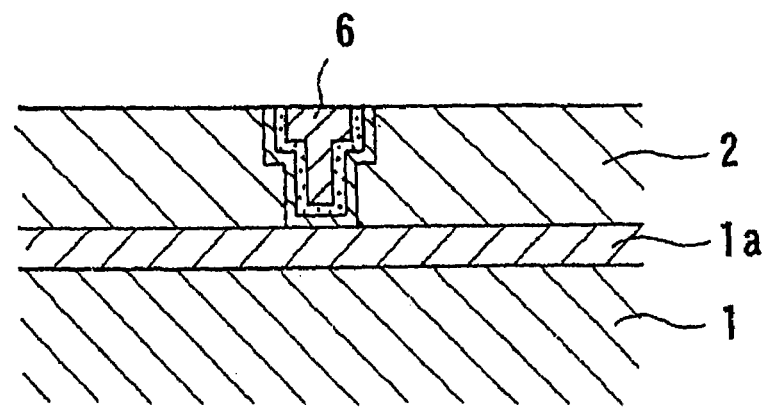
Figure 23:
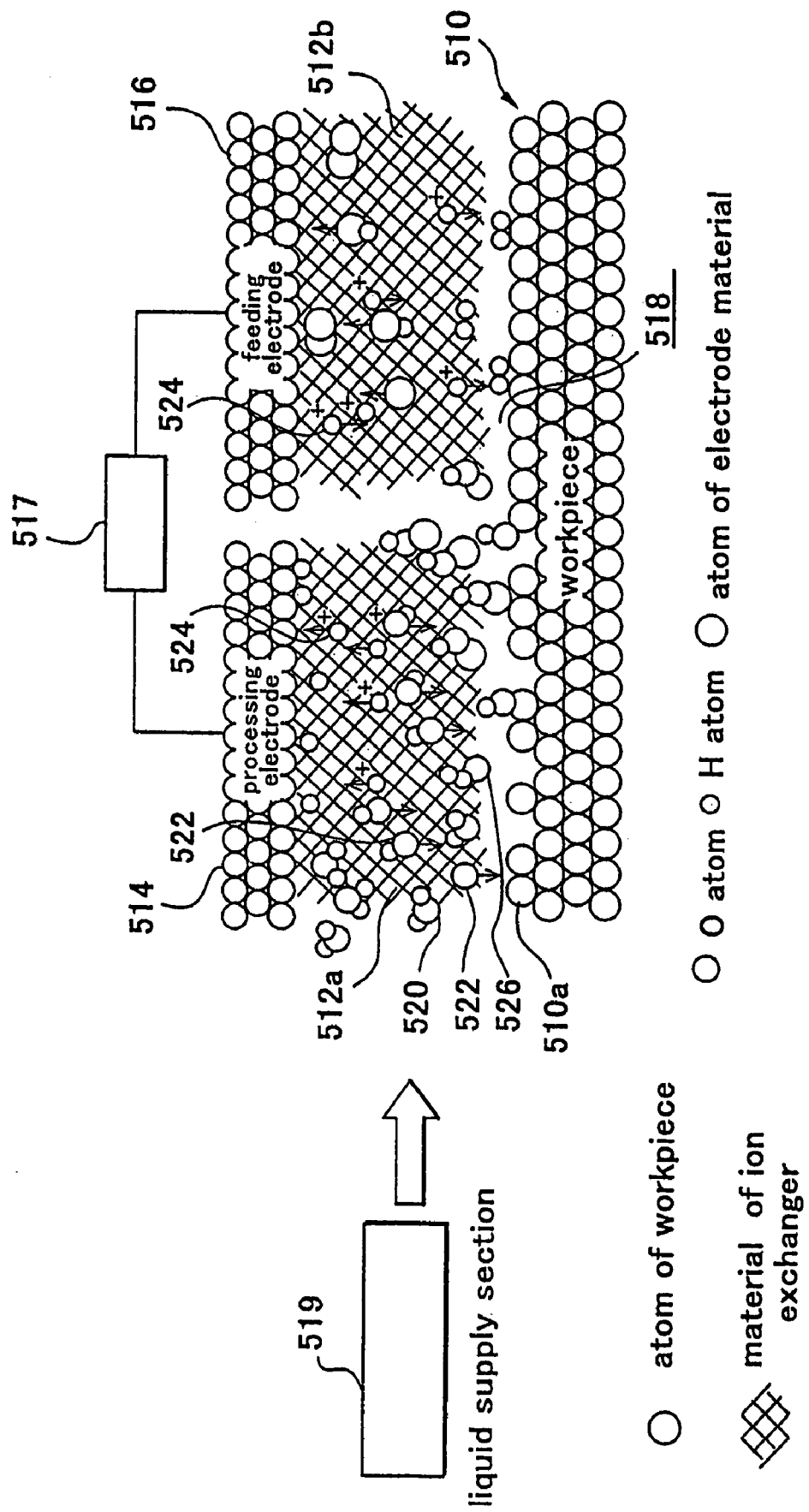
FIG. 23 is a view illustrating a principle of electrolytic processing with an ion exchanger.

Then, as shown in FIG. 22(*c*), a top surface of the copper coating 6, filled in the contact hole 3 as well as in the groove 4 for wiring, and a surface of the insulation coating 2 are positioned on almost the same plane, and when it is detected that the wiring comprising the copper coating 6 is completed, the top ring 74 is raised with rotation of the polishing table 30 and the top ring 74 stopped, and further supply of the abrasive solution is stopped to terminate chemical-mechanical polishing.

After this polishing is finished, the substrate W is delivered to the pusher 16 by pivoting the top ring head 68. The carrier robot 20 receives the substrate W from the pusher 16, carries it to the reversing unit 14 to reverse it therein, if necessary, and then carries it to the cleaning device 18 to subject the substrate to cleaning and drying, and finally the substrate W is returned to the cassette in the load/unload section 12.

The example described above assumes a case where deionized water, or more preferably ultrapure water is supplied to electrolytic processing section 26. By performing the electrolytic processing using deionized or more preferably ultrapure water containing no electrolyte, deposition of impurities such as extra electrolyte on the surface of the substrate W will be avoided, and if deposition occurs, the impurities can completely be removed. Furthermore, because the ion exchanger 48 immediately captures, by an ion exchange reaction, copper ions and the like which have been dissolved during the electrolytic processing, there will be no further precipitation of copper ions or the like on the surface of the substrate W or on any other parts, and no contamination will occur on the surface of the substrate W because of formation of fine particles by oxidization.

As ultrapure water has a high specific resistance and a current hardly flows smoothly therethrough, a distance between an electrode and a workpiece is set to a small value or an ion exchanger is inserted between the electrode and the workpiece to reduce resistance, but reduction in power can also be achieved by using an electrolytic solution concurrently to reduce electric resistance. In a case of processing with an electrolytic solution, an area to be processed in a workpiece tends to cover a slightly wider area than that in processing by electrode processing. However, when processing is performed with a combination of ultrapure water and an ion exchanger, no electricity runs in the ultrapure water so that the processing is limited only to an area where a processing electrode of a workpiece and the ion exchanger are projected.

Further, in place of the deionized water or the ultrapure water, an electrolytic solution prepared by adding an electrolyte in deionized water or ultrapure water may also be used. By using an electrolytic solution, further reduction of power consumption can be achieved as specific resistance is further lowered. As the electrolytic solution, for instance, solutions of neutral salts such as NaCl, $Na^2SO^4$, acids such as HCl, $H^2SO^4$, and alkali like ammonia may be used, and any of those described above may be selected according to characteristics of a workpiece. It is desirable, when using electrolytic solution, to have a minimal clearance gap between wafer W and the ion exchanger 48 for preventing these members from contacting each other directly.

Further, in place of deionized water or ultrapure water, a solution prepared by adding such a material as a surface active agent to adjust electric conductivity to a value less than 500 µS/cm, preferably less than 50 µS/cm, and more preferably less than 0.1 µS/cm (with a specific resistance of at least 10 MΩ·cm) may be used. By using the solution prepared by adding a surface active agent to the deionized water or ultrapure water, it is possible to form a layer having a stable inhibitory action for preventing ions from moving onto an interface between wafer W and the ion exchanger 48, thereby improving flatness of a processed surface by moderating a concentration of ion exchange (dissolution of metal). A concentration of the surface active agent should preferably be less than 100 ppm. When a value of conductivity is too high, a processing speed becomes lower, but by using a solution with a conductivity of less than 500 µS/cm, preferably less than 50 µS/cm and more preferably less than 0.1 µS/cm, a desired processing speed can be achieved.

Further, with the present invention, the ion exchanger 48 is placed between the wafer W and the processing electrodes 44 and between the substrate W and the feeding electrodes 46 to substantially improve a processing speed. In short, electrolytic processing with ultrapure water is achieved by a chemical interaction between hydroxide ions in the ultrapure water and material to be processed. As a concentration of hydroxide ions as a reacting species contained in the ultrapure water is extremely low ($10^{-7}$ mol/L at normal temperature and pressure), efficiency in processing for removal may be lowered due to reactions other than that for action for removal (such as formation of an oxide film). In order to keep removal reactions at a high efficiency level, an increase in hydroxide ions is required. To increase hydroxide ions, there is a method in which dissolution of water molecules in ultrapure water is promoted by using a catalytic substance; one useful material available for that purpose is an ion exchanger. Specifically, an amount of energy required for activating dissolution of water molecules is lowered as a result of interactions between a functional group in the ion exchanger and water molecules. Thus, the processing speed can be raised by promoting dissolution of water.

In this process, if copper is electrolytically processed using the ion exchanger 48 with a cation exchange group given thereto, the copper is saturated with ion exchange groups of the ion exchanger (cation exchanger) 48, and in that case processing efficiency in a subsequent process is lowered. Further, if copper is electrolytically processed using the ion exchanger 48 with an anion exchange group assigned thereto, fine particles of copper oxide are deposited on a surface of the ion exchanger (anion exchanger) 48, and contamination may occur on a surface of a substrate to be processed next.

To avoid problems described above, the regenerating head 58 held at the free end of the oscillating arm 56 is moved close to or into direct contact with the ion exchanger 48 on the processing table 42, and in that state an electric potential reverse to that applied during processing is applied to the ion exchanger 48 from the power supply unit 52, which promotes dissolution of extraneous matter such as copper deposited on the ion exchanger 48; thus, the ion exchanger 48 being regenerated during this processing. In this case, regenerated ion exchanger 48 is rinsed with deionized or ultrapure water supplied to the top surface of the processing table 42.

Figure 4:
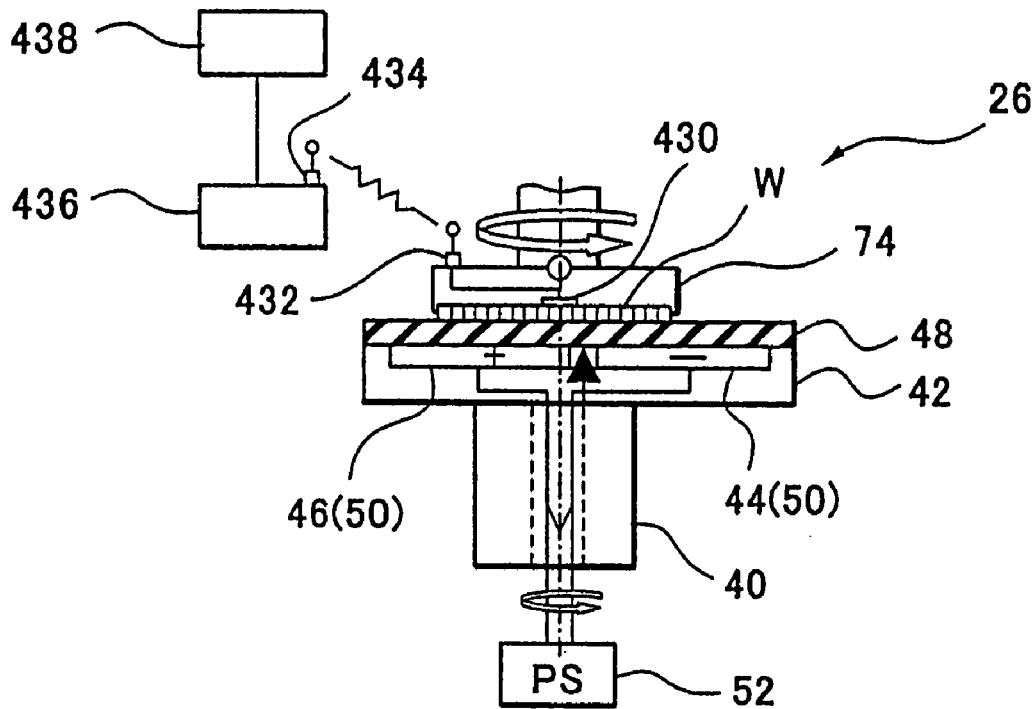
FIG. 4 is a cross-sectional view showing a key section of an electrolytic processing section according to another embodiment of the present invention.
Figure 5:
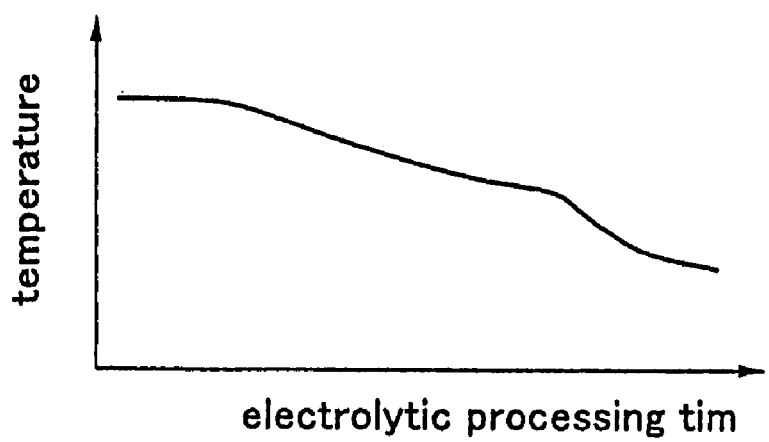
FIG. 5 is a graph showing a relationship between temperature and electrolytic processing time.

FIG. 4 shows a main section of the electrolytic processing device according to another embodiment of the present invention, and this section detects an end point of electrolytic processing by detecting a change in a calorific value generated during processing between processing electrode 44 and feeding electrode 46 by checking a change of temperature of substrate W. More specifically, a temperature sensor 430 for directly detecting a surface of a rear surface of substrate W held by top ring 74 is embedded in a lower edge surface of the top ring 74, and a signal detected by the temperature sensor 430 is sent to a signal processor 436 as a processing end point detecting section through telemeters 432, 434, and the signal processed by this signal processor 436 is sent to control section 438. Other configurations are almost the same as those described above.

As the temperature sensor 430, for example, a thermistor or a thermocouple is used; however, other types of sensors may also be used. The substrate W, such as a semiconductor wafer, is generally extremely thin and includes silicon as its main ingredient, so that thermal conductivity of the substrate W is very high. Because of this feature, by monitoring a temperature at a rear surface of the substrate W, a calorie value generated between processing and feeding electrodes 44, 46 and the substrate W can be detected.

In electrolytic processing, heat is generated not only by electrical resistance on a surface of a workpiece but also because of collisions of ions and water molecules moving around in a solution (deionized water) between a processing surface and the electrodes, and for instance, when electrolytic polishing is executed at a fixed voltage for polishing copper coating 6 deposited on a surface of substrate W as shown in FIG. 22B, electric resistance becomes larger with a current becoming smaller as electric processing proceeds and the barrier layer 5 or the insulating film 2 is exposed, and a heat value and a temperature of the substrate W held by the top ring 74 gradually drops. Therefore, by detecting the heat value (temperature of the substrate W) to determine an integrated processing rate, it is possible to detect a processing end position.

In other words, in this example, the signal processor 436 determines that the barrier layer 5 comprising, for instance, TaN or the like has been exposed on a surface of the substrate W and judges that a processing end point has come when it detects, by receiving a signal generated and detecting a temperature change with the temperature sensor 430 and transmitted from the telemeters 432, 434, that a degree of change in the temperature has reached a predetermined value. This signal processor 436 transmits, when it detects an end point of processing, a signal indicating the end of processing to the control section 438.

Figure 6:
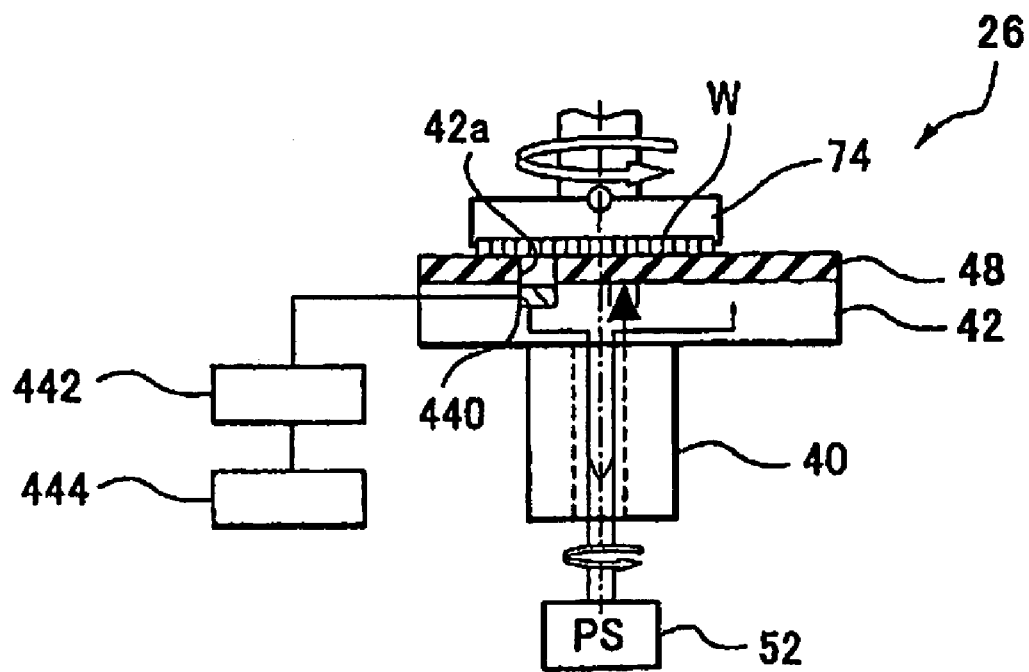
FIG. 6 is a cross-sectional view showing a key section of an electrolytic processing section according to a further different embodiment of the present invention.

FIG. 6 shows a main portion of an electric processing section according to another embodiment of the present invention, and this portion detects an end point of processing by detecting a change in amplitude of light introduced onto a surface of copper coating 6 and light reflected from this surface. In other words, an optical sensor 440 having a recessed section 42a exposed upward provided thereon, and equipped with a light emitting element and a light receiving element in the recessed section is provided on the processing table 42. A signal detected by this optical sensor 440 is provided as an input to signal processor 442 which acts as a processing end point detecting section, and the signal processed by the signal processor 442 is input to control section 444. Other portions of this configuration are similar to those described above.

The optical sensor 440 emits light from the light emitting element to a surface to be processed of substrate W held by top ring 74, that is a surface of the copper coating 6, and receives light reflected from this processed surface (copper coating 6) by virtue of the light receiving element. In this case, the light emitted from the light emitting element is, for instance, a laser beam or the light emitting element is an LED.

When the copper coating 6 deposited on a surface of the substrate W shown in FIG. 22(b) is electrolytically polished while controlling voltage at a constant level as electrolytic processing proceeds and the barrier layer 5 and further the insulating film 2 are exposed, an amplitude of reflected light changes due to different reflection indexes between the barrier layer 5 and the insulating film 2. Therefore, it is possible to determine an integrated processing range by detecting the amplitude of the reflected light to determine a processing end point.

Briefly, in this case, when the signal processor 442 receives a signal detected by the optical sensor 440 and determines, for instance, that a change in amplitude of reflected light has reached a predetermined value, the signal processor determines, for instance, that the barrier layer 5 comprising such a material of TaN has been exposed on a surface of the substrate W, and judges that a processing end point has arrived. When the signal processor 442 determines arrival of the processing end point, it sends a signal indicating an end of processing to the control section 444.

Figure 7:
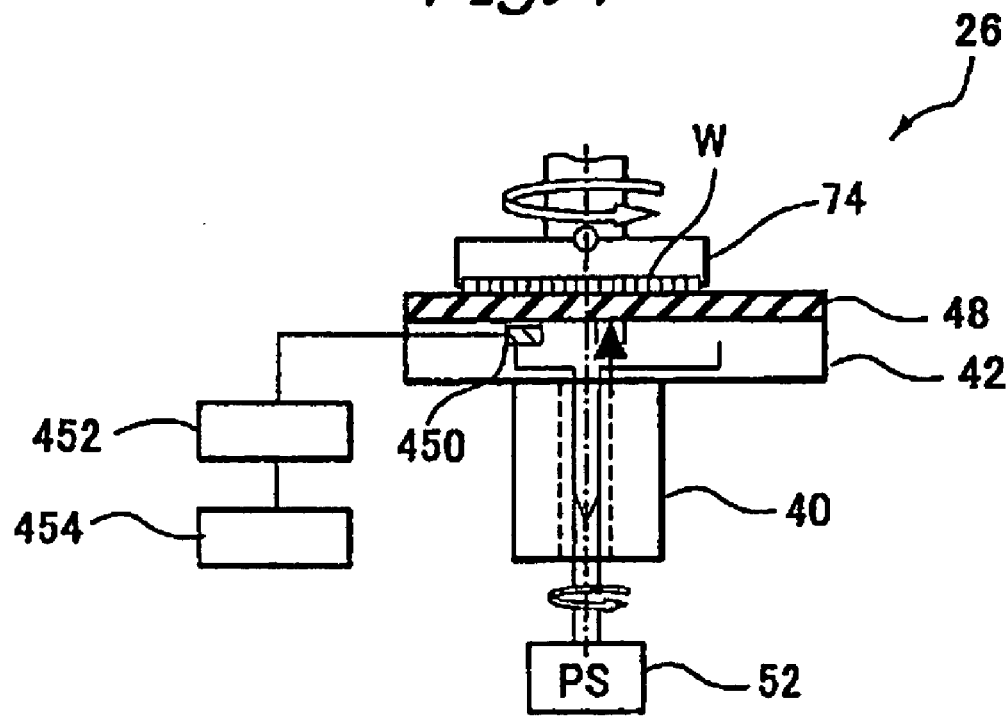
FIG. 7 is a cross-sectional view showing a key section of an electrolytic processing section according to a still further different embodiment of the present invention.

FIG. 7 shows a main portion of the electrolytic processing device according to still another embodiment of this present invention. This portion detects an end point of processing by detecting a change in an eddy current generated during processing inside a workpiece, namely in copper coating 6.

Namely, an eddy current sensor 450 which generates an eddy current inside a conductive film such as the copper coating 6 deposited on a surface of substrate W, and detects an amplitude of this generated eddy current, is embedded in processing table 42, and a signal detected by this eddy current sensor 450 is input to a signal processor 452 which acts as a processing end point detecting section. The signal processed by the signal processor 452 is input to a control section 454. Other portions of this configuration are similar to those described above.

The eddy current sensor 450 is equipped with a sensor coil. By supplying a high-frequency current to the sensor coil, an eddy current can be generated inside the conductive film such as the copper coating 6 deposited on the surface of the substrate W, and an amplitude of the eddy current varies in proportion to a thickness of the conductive film or copper coating 6.

For this reason, in this example, the eddy current sensor 450 detects an amplitude of an eddy current generated inside the conductive film such as the copper coating 6 deposited on the surface of the substrate W. A signal detected by this eddy current sensor 450 is sent to the signal processor 452. When this signal processor 452 detects, for instance, that a change in the eddy current is increased over a predetermined value, it determines that barrier layer 5 comprising TaN or the like has been exposed, and detects a processing end point. When the signal processor 452 detects the processing end point, it sends a signal indicating the processing end point to the control section 454.

Figure 8:
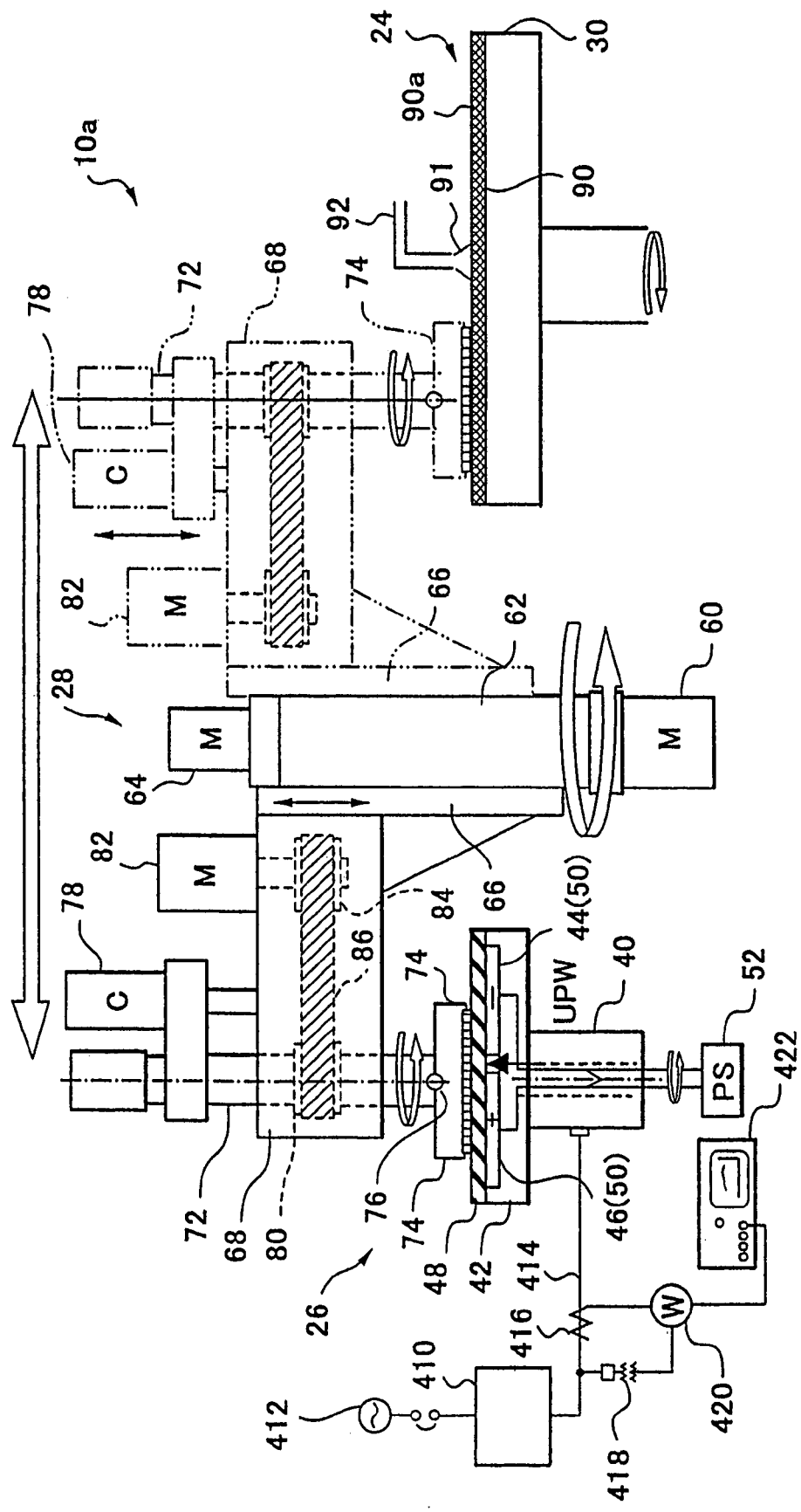
FIG. 8 is a front view showing a substrate processing apparatus according to a second embodiment of the present invention.

FIG. 8 shows a substrate processing apparatus 10a according to a second embodiment of this present invention. Differences between the substrate processing apparatus 10a and the substrate processing apparatus 10 shown in FIG. 1 and FIG. 2 are that a fixed abrasive member 90 comprising a fixed abrasive is adhered on a surface (top surface) of polishing table 30 to use a surface of this fixed abrasive member 90 as polishing surface 90a so as to form chemical-mechanical polishing section 24, and that polishing solution nozzle 92, for supplying deionized water not containing any abrasive materials or a solution 91 prepared by adding an additive such as a surface active agent to the deionized water, is provided at a position above the polishing table 30.

The fixed abrasive member is formed by mixing abrasive particles such as ceria or silica in a binder such as a thermosetting resin such as an epoxy resin, a thermoplastic resin, or a core shell type of resin such as MBS or ABS, and molding this mixture with a die into a plate form. A ratio of the abrasive particles: binder: void =10-50% : 30-80% : 0-40% (boundary values included).

The fixed abrasive member 90 constitutes an extremely hard polishing face 90a and prevents occurrences of scratches and ensures a stable processing speed. Further, the fixed abrasive member 90 executes chemical-mechanical polishing by supplying deionized water not containing any abrasive particles or a solution prepared by adding an additive such as a surface active agent to deionized water, so that enabled is a reduction of a usage of a polishing solution which is expensive and hard to treat.

Figure 9:
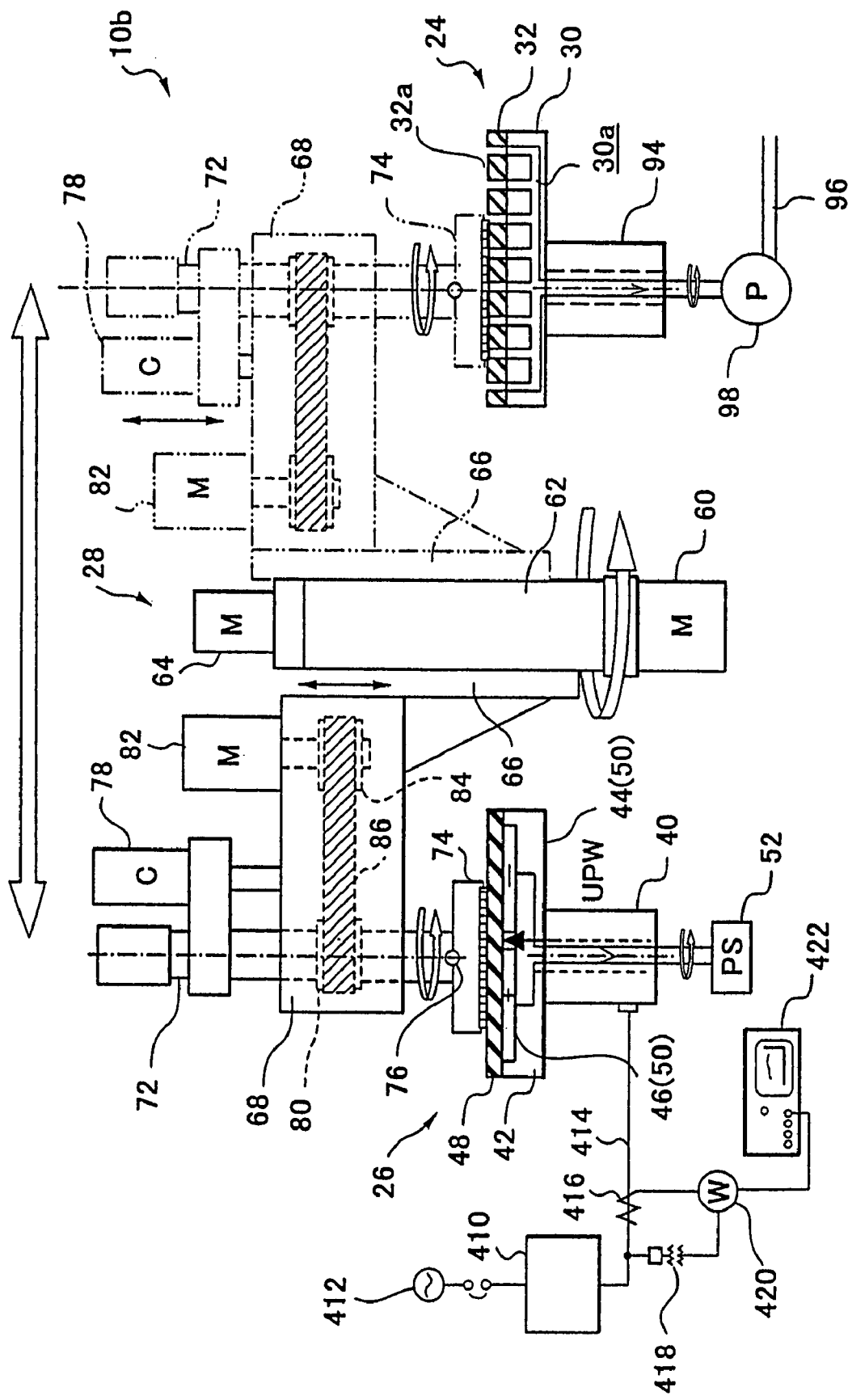
FIG. 9 is a front view showing a substrate processing apparatus according to a third embodiment of the present invention.

FIG. 9 shows a substrate processing apparatus 10b according to a third embodiment of the present invention. Differences between this substrate processing apparatus 10b and the substrate processing shown in FIG. 1 and FIG. 2 are: that polishing table 30 has a diameter slightly larger than that of substrate W and performs an orbital motion not associating rotation of itself, namely so-called translational movement (scroll movement) in accordance with rotation of hollow motor 94; and that an abrasive solution is supplied to polishing pad 32 through a hollow section of the hollow motor 94 and an abrasive solution path 30a provided inside the polishing table 30 when a pump 98 installed in an abrasive solution feed line 96 runs. In this example, it is possible to reduce a size of the polishing table 30 and also to keep a sliding speed between the substrate W and a polishing surface 32a of the polishing pad 32 at a constant level over an entire surface of the substrate W.

Figure 10:
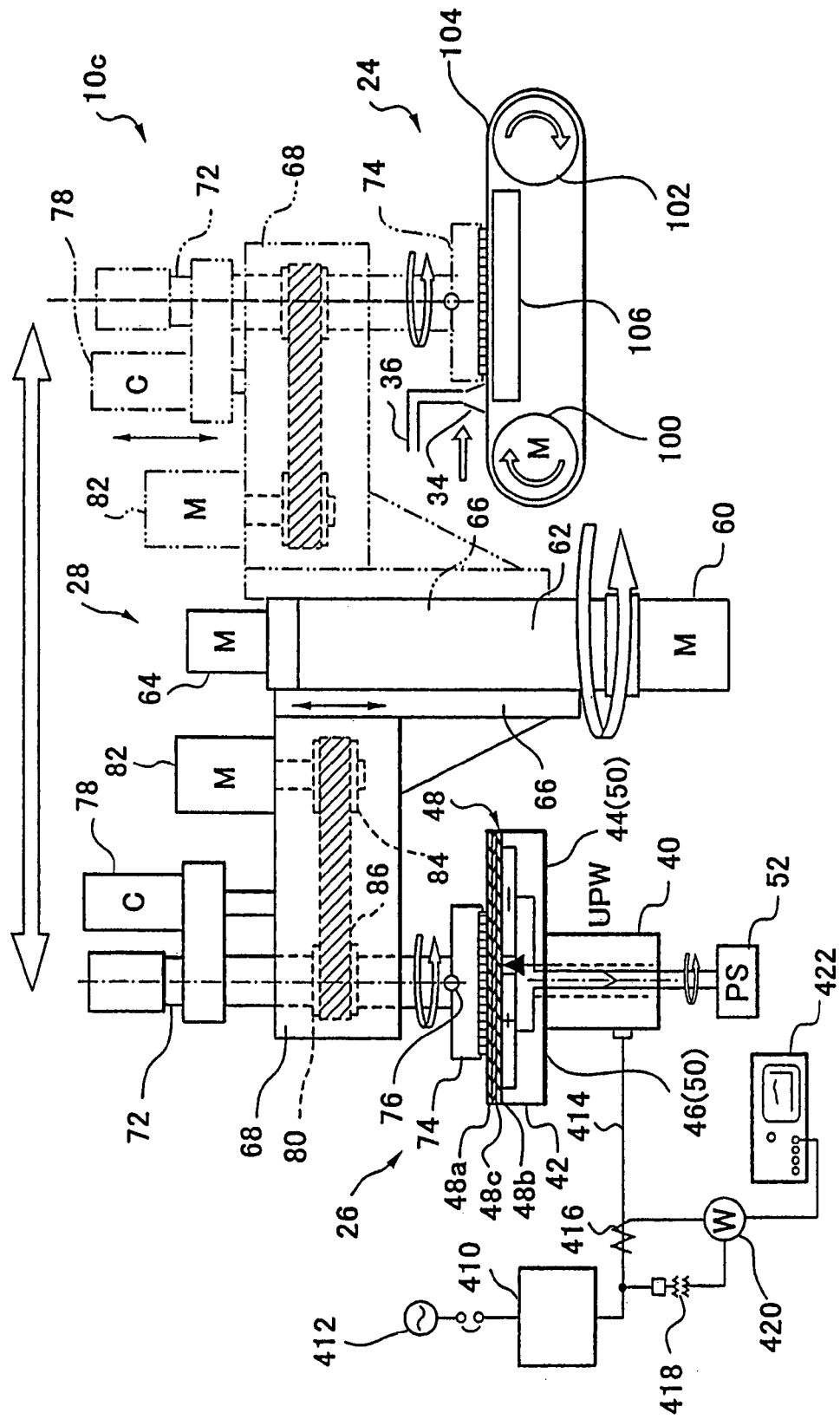
FIG. 10 is a front view showing a substrate processing apparatus according to a fourth embodiment of the present invention.

FIG. 10 shows a substrate processing apparatus 10c according to a fourth embodiment of the present invention. Differences between this substrate processing apparatus 10c and the substrate processing apparatus 10 shown in FIG. 1 and FIG. 2 are: that as chemical-mechanical polishing section 24, an endless type of polishing pad is spanned over a drive roller 100, driven by a motor, and a driven roller 102 located parallel to the drive roller 100 so that it can run freely, and a pressing base 106 is placed under polishing cloth 104 running above; and that a three-layered laminated body consisting of a pair of strongly acidic cation exchange textile 48a, 48b and a strongly acidic cation exchange film 48c held between these strongly acidic cation exchange textile 48a, 48b is used as ion exchanger 48 placed on a top surface of processing table 42 of electrolytic processing section 26. Abrasive solution nozzle 36 for supplying abrasive solution 34 is placed on an upstream side from the pressing base 106. The ion exchanger (laminated body) 48 has high water-permeability, and not only solidity is very high, but also an exposed surface (top surface) opposing substrate W has excellent smoothness.

In this example, the substrate W held via cylinder 78 by top ring 74 is pressed to a polishing surface of the polishing cloth 104 with a predetermined pressing force and the polishing cloth 104 runs while the top ring 74 is rotated, and at the same time the abrasive solution 34 is supplied from the abrasive solution nozzle 36 to the polishing cloth 104; thus, a top surface (undersurface) of the substrate W being chemically-mechanically polished.

Since the ion exchanger 48 is formed as a multi-layered structure by overlaying a plurality of sheets of ion exchange materials such as non-woven cloth, woven cloth, or porous films, a total ion exchange capacity of the ion exchanger 48 can be increased, and thereby negative influences of oxides over a processing rate can be prevented by suppressing generation of oxides upon processing (polishing) copper for removal. Namely, when a total ion exchange rate by the ion exchanger 48 is smaller than a quantity of copper ions fetched during a removing process, oxides are generated on a surface of or inside the ion exchanger, which negatively affects a processing rate. It is assumed that this phenomenon occurs because a quantity of ion exchange groups in the ion exchanger affects the processing rate and copper ions over a required capacity are converted to oxides. To overcome this problem, generation of oxides can be suppressed by making larger a total ion exchange rate by using an ion exchanger based on a multilayered structure consisting of a plurality of sheets of ion exchange material.

Figure 11:
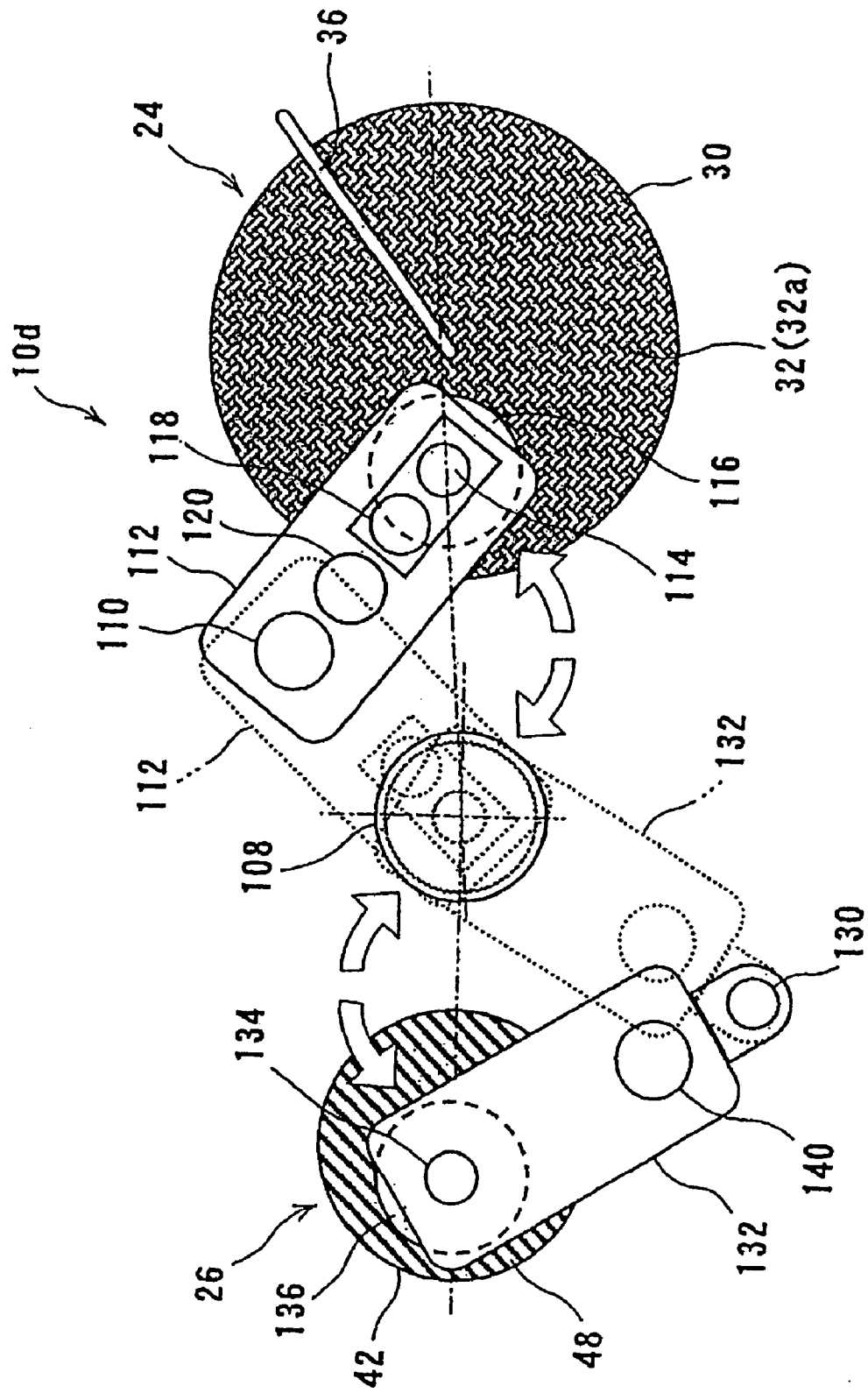
FIG. 11 is a flat view showing a substrate processing apparatus according to a fifth embodiment of the present invention.

FIG. 11 shows a substrate processing apparatus 10d according to a fifth embodiment of the present invention. This substrate processing apparatus 10d has chemical-mechanical polishing section 24 and electrolytic processing section 26 similar to those used in the substrate processing apparatus 10 shown in FIG. 1 and FIG. 2, and a pusher 108 having a load/unload mechanism is provided between this chemical-mechanical polishing section 24 and the electrolytic processing section 26.

Further, disposed at a side of the chemical-mechanical polishing section 24 is a first pivot 110 which is freely pivotable, and a first top ring head 112 which is oscillatable in accordance with a pivotal movement of the pivot 110 is mounted on the pivot 110 so that it can freely move in a vertical direction. A first elevating shaft 114 is rotatably supported at a free end of this first top ring head 112, and a first top ring 116 for releasably holding a substrate W is attached to a lower edge of this first elevating shaft 114. Further, a cylinder 118 for pressing the substrate W held by this first top ring 116 against a polishing surface 32a of polishing table 30 with a predetermined force, and a motor 120 for rotating the first top ring, are provided therein.

With this configuration as described above, it is possible to suck and hold a substrate W placed on the pusher 108 by virtue of the first top ring moved to a position directly above the pusher 108 by causing pivotal movement of the first pivot 110, to move the substrate W held by this first top ring 116 to a position above the polishing table 30 by causing pivotal movement of the first pivot 110, to perform chemical-mechanical polishing of a surface of the substrate W at this position, and to move polished substrate W to a position just above the pusher 108 by causing pivotal movement of the first pivot 110 and return it to the pusher 108.

On the other hand, disposed at a side of the electrolytic processing section 26 is a second pivot 130 which is freely pivotable, and a second top ring head 132 oscillating in accordance with pivotal movement of the pivot 130 is disposed on this second pivot 130 so that it can move freely in the vertical direction. A second elevating shaft 134 is rotatably supported at a free edge of this second top ring head 132, and a second top ring 136 for releasably holding the substrate W is attached to a lower edge of this second elevating shaft 134. Further, a motor 140 for rotating the second top ring 136 is provided therein.

With this configuration, it is possible to suck and hold the substrate W placed on the pusher 108 by virtue of the second top ring 136 moved to a position just above the pusher 108 by causing pivotal movement of the second pivot 130, to move the substrate W held by this second top ring 136 to a position above processing table 42 by causing pivotal movement of the second pivot 130 and electrolytically process a surface of the substrate W at this position, and to move the substrate W having been subjected to electrolytic processing to a position just above the pusher 108 by causing pivotal movement of the second pivot 130 and return it onto the pusher 108.

In this example, it is possible to place a substrate polished, for instance, by the chemical-mechanical polishing section 24 on the pusher 108, and also to electrolytically machine this polished substrate W placed on the pusher 108 in the electrolytic processing section and then return it to the pusher 108, and thus two types of processing, namely chemical-mechanical polishing in the chemical-mechanical polishing section 24 and electrolytic processing (etching) in the electrolytic processing section 26 can sequentially be performed.

Figure 12:
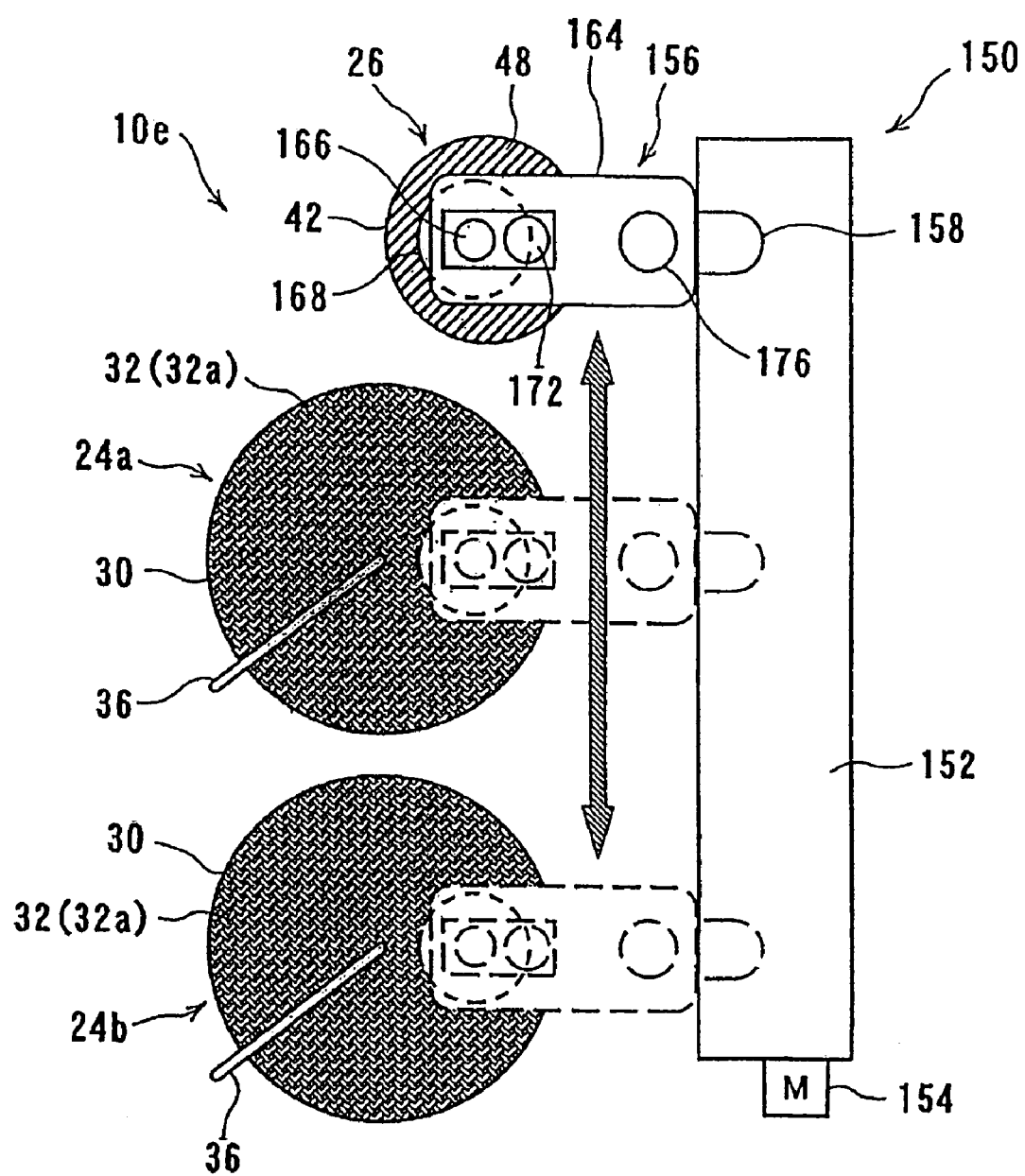
FIG. 12 is a flat view showing a substrate processing apparatus according to a sixth embodiment of the present invention.
Figure 13:
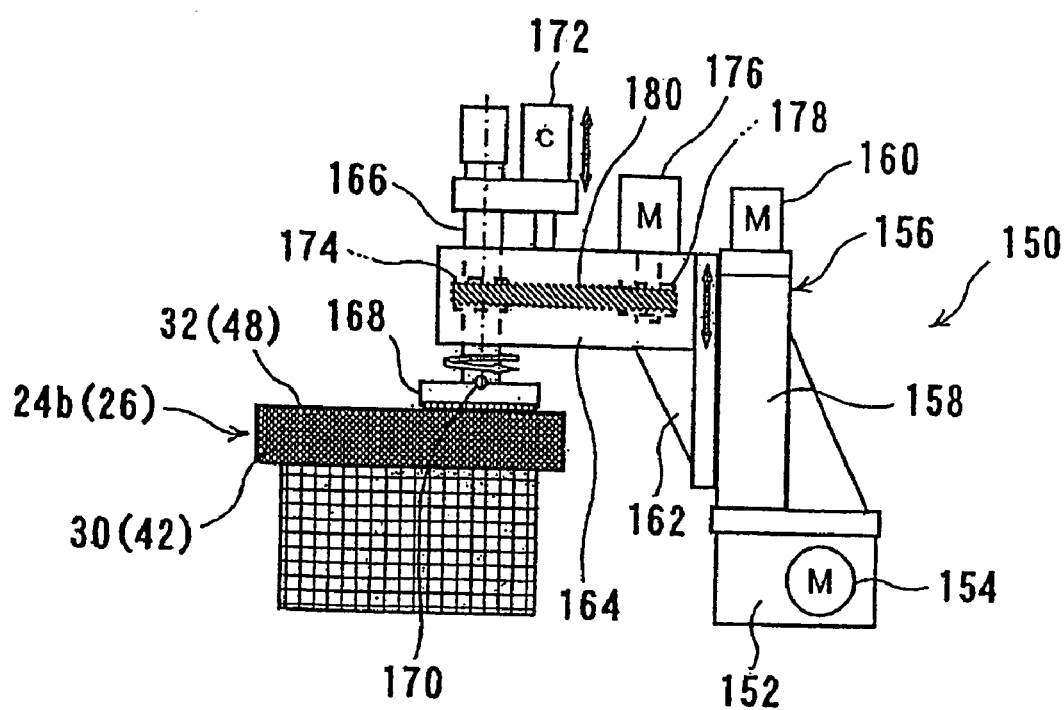
FIG. 13 is a front view showing the substrate processing apparatus shown in FIG. 12.

FIG. 12 and FIG. 13 show a substrate processing apparatus 10e according to a sixth embodiment of the present invention. This substrate processing apparatus 10e has two chemical-mechanical polishing sections 24a, 24b and one electrolytic processing section 26, all of which are similar to those in the substrate processing apparatus 10 shown in FIG. 1 and FIG. 2. The chemical-mechanical polishing sections 24a, 24b and the electrolytic processing section 26 are provided at positions along a straight line, and a substrate carrier device 150 which runs holding substrate W is provided at a side thereof.

This substrate carrier device 150 has a base 152 and a running section 156, which has a configuration similar to the carrier section 28 of the substrate processing apparatus 10 shown in FIG. 1 and FIG. 2 and is capable of running along the base 152 when driven by running motor 154 provided in the base 152. This running section 156 has a support 158, and an elevating plate 162 which moves up and down in an axial direction when driven by a motor 160 attached to an upper end of the support 158 is provided on this support 158, and a base end section of top ring head 164 extending in a horizontal direction is fixed to this elevating plate 162. An elevating shaft 166 is provided at a free end of this top ring head 164, and a top ring 168 releasably holding a substrate W is provided at a lower end of this elevating shaft 166 via a ball joint 170 so that it can freely incline.

Disposed parallel to the elevating shaft 166 is a cylinder 172 for pressing the substrate W held by the top ring 168 via the elevating shaft 166 with a predetermined pressing force to polishing surface 32a of polishing table 30. Further, a timing belt 180 connects driven pulley 174 attached to this elevating shaft 166 with drive pulley 178 attached to a drive shaft of motor 176 for rotating the top ring, and because of this configuration, the top ring 168 rotates monolithically with the elevating shaft 166.

With this configuration, for instance, when it is required to perform chemical-mechanical polishing first in one of the chemical-mechanical polishing sections 24a, then electrolytic processing in the electrolytic processing section 26, and finally again chemical-mechanical polishing in the other chemical-mechanical polishing section 24b, in a state where the substrate W is held by the top ring 168, the top ring 168 is moved to a position above the polishing table 30 of the chemical-mechanical polishing section 24a by making the running section 156 run. Then, the top ring 168 is caused to descend and the polishing table 30 and the top ring 168 are rotated in a state where the substrate W held by the top ring 168 via the cylinder 172 is pressed with a predetermined pressing force against the polishing surface 32a of the polishing table 30, and concurrently an abrasive solution is supplied from abrasive solution nozzle 36 to polishing pad 32. By these operations, a top surface (or undersurface) of the substrate W is subjected to chemical-mechanical polishing.

Then, in a state where the substrate W is held by the top ring 168, the top ring 168 is moved upward and the running section 156 runs to move the top ring 168 to a position above processing table 42 of the electrolytic processing section 26. The motor 160 rotates to move the substrate W held by the top ring 168 to a position close to or directly contacting ion exchanger 48 on the processing table 42, and in this state the processing table 42 and the top ring 168 are rotated, and at the same time a voltage is applied between processing electrode 44 and feeding electrode 46 while supplying deionized water or preferably ultrapure water to the ion exchanger 48 on the processing table 42. With this operation, a top surface (undersurface) of the substrate is electrolytically processed (etched).

Then, in the state where the substrate W is held by the top ring 168, the top ring 168 is moved upward with the running section 56 running to move the top ring 168 to a position above polishing table 30 of the chemical-mechanical polishing section 24b. Then, as described above, the polishing table 30 and the top ring 168 are rotated, pressing with a predetermined force the substrate W held via the cylinder 172 by the top ring 168 against polishing surface 32a of the processing table 30, and concurrently an abrasive solution is supplied from abrasive solution nozzle 36 to polishing pad 32 to chemically-mechanically polish a surface (undersurface) of the substrate.

In each of the chemical-mechanical polishing sections 24a, 24b, chemical-mechanical polishing is performed with processing steps being changed. Changing a process step means changing at least one of processing tools, a relative speed between a substrate and a polishing surface, a processing solution, and a pressing force against the substrate or the like. It is to be understood herein that the chemical-mechanical polishing may be performed with different process steps in the same chemical-mechanical polishing section.

Figure 14:
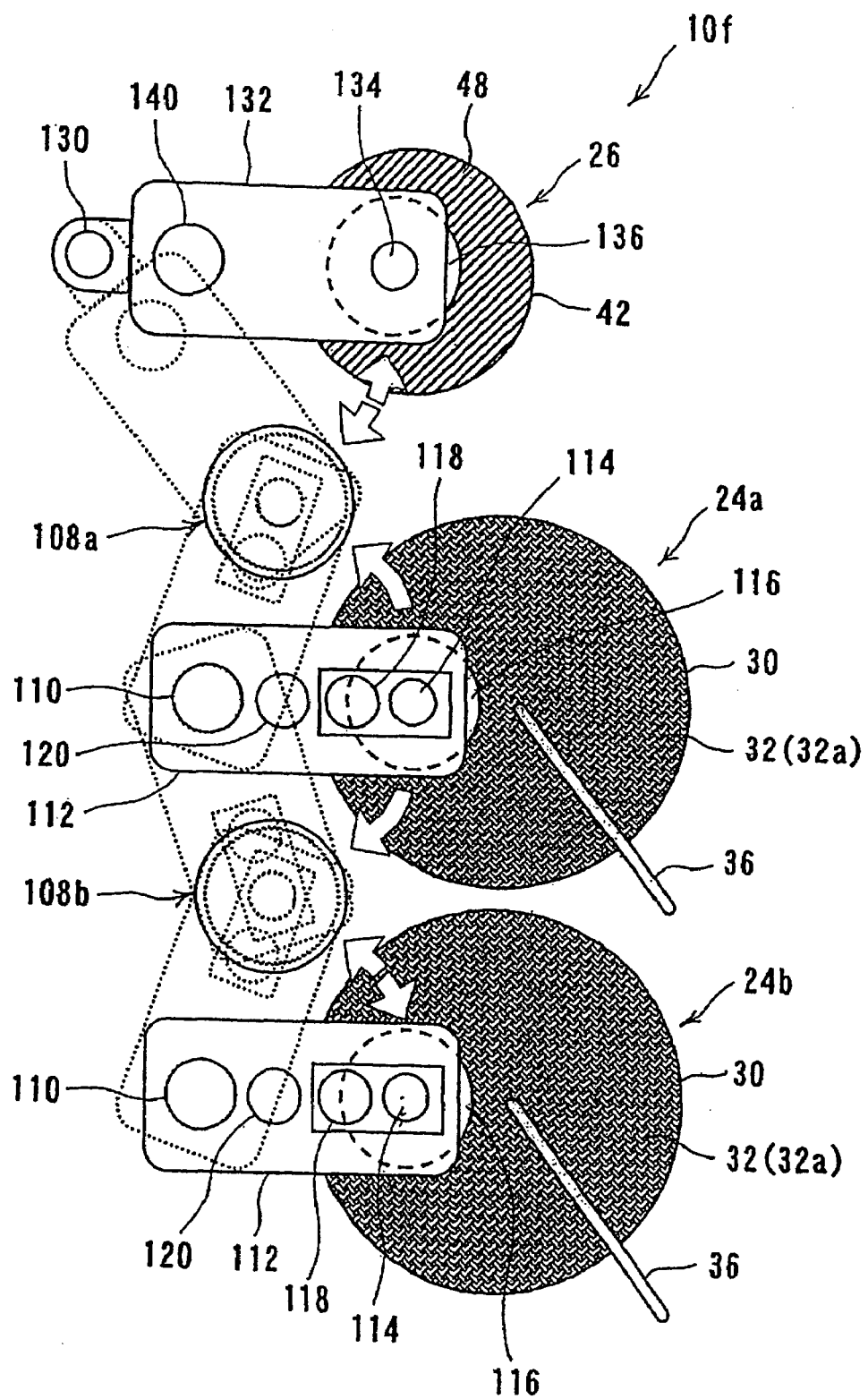
FIG. 14 is a flat view showing a substrate processing apparatus according to a seventh embodiment of the present invention.

FIG. 14 shows a substrate processing apparatus 10f according to a seventh embodiment of the present invention. This substrate processing apparatus 10f has two chemical-mechanical polishing sections 24a, 24b and an electrolytic processing section 26, all of which have a configuration similar to those in the substrate processing apparatus 10 shown in FIG. 1 and FIG. 2. Pushers 108a, 108b, each having a load/unload mechanism which has a configuration similar to that provided in the substrate processing apparatus 10d shown in FIG. 11, are provided between the chemical-mechanical polishing section 24a and the electrolytic processing section 26 and between the two chemical-mechanical polishing sections 24a, 24b, respectively.

Further, provided at a side of each of the chemical-mechanical polishing sections 24a, 24b is a first pivot 110 which is freely pivotable and has a configuration similar to that of the first pivot 110 provided in the substrate processing apparatus 10d shown in FIG. 11. With this configuration it is possible to suck and hold a substrate W placed on the pusher 108a or pusher 108b by first top ring 116 having been moved to a position just above the pusher 108a or 108b by causing pivotal movement of the first pivot 110, to move the substrate W held by this top ring 116 to a position above processing table 30 by causing pivotal movement of the first pivot 110 and performing chemical-mechanical polishing on a surface of the substrate W at this position, and to move polished substrate W to a position just above the pusher 108a or 108b by causing pivotal movement of the first pivot 110 and return it to the pusher 108a or 108b.

On the other hand, disposed at a side of the electrolytic processing section 26 is a second pivot 130 having a configuration similar to that in the substrate processing apparatus 10d shown in FIG. 11. With this configuration it is possible to suck and hold the substrate W placed on the pusher 108a with second top ring 136 having been moved to a position just above the pusher 108a by causing pivotal movement of the second pivot 130, to move the substrate W held by this second top ring 136 to a position above processing table 42 by causing pivotal movement of the second pivot 130 and performing electrolytic processing (etching) on a surface of the substrate W at this position, and then to move electrolytically processed substrate W to a position just above the pusher 108a by moving the second pivot 130 upward and returning it to the pusher 108a.

In this example, for instance, a substrate having been subjected to electrolytic processing in the electrolytic processing section 26 is placed on the pusher 108a; the substrate having been subjected to electrolytic processing and placed on the pusher 108a is polished in the chemical-mechanical polishing section 24a; then this polished substrate is placed on the pusher 108b; and then the polished substrate placed on the pusher 108b is polished in the chemical-mechanical polishing section 24b and returned to the pusher 108b. With this configuration, by delivering the substrate W via the pushers 108a and 108a, chemical-mechanical polishing in the chemical-mechanical polishing sections 24a, 24b and electrolytic processing (etching) in the electrolytic processing section 26 can be performed sequentially.

In this example, two pushers 108a, 108b each having a load/unload mechanism are provided; however, for example, a configuration in which a pusher having a load/unload mechanism is provided only between the chemical-mechanical polishing section 24a and the electrolytic processing section 26, and an ordinary top ring is provided between the two chemical-mechanical polishing sections, may be used.

Figure 15:
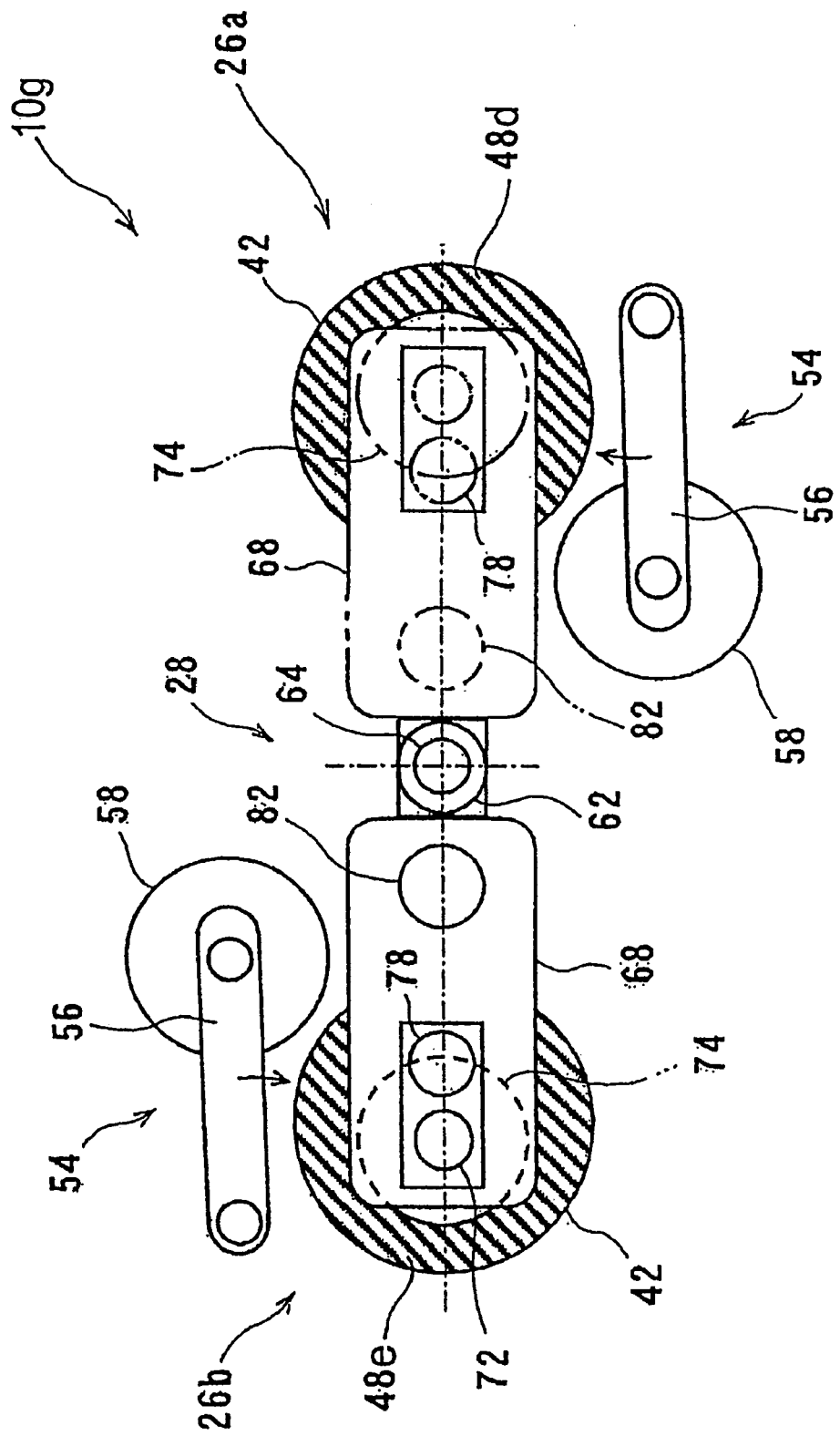
FIG. 15 is a flat view showing a substrate processing apparatus according to an eighth embodiment of the present invention.
Figure 16:
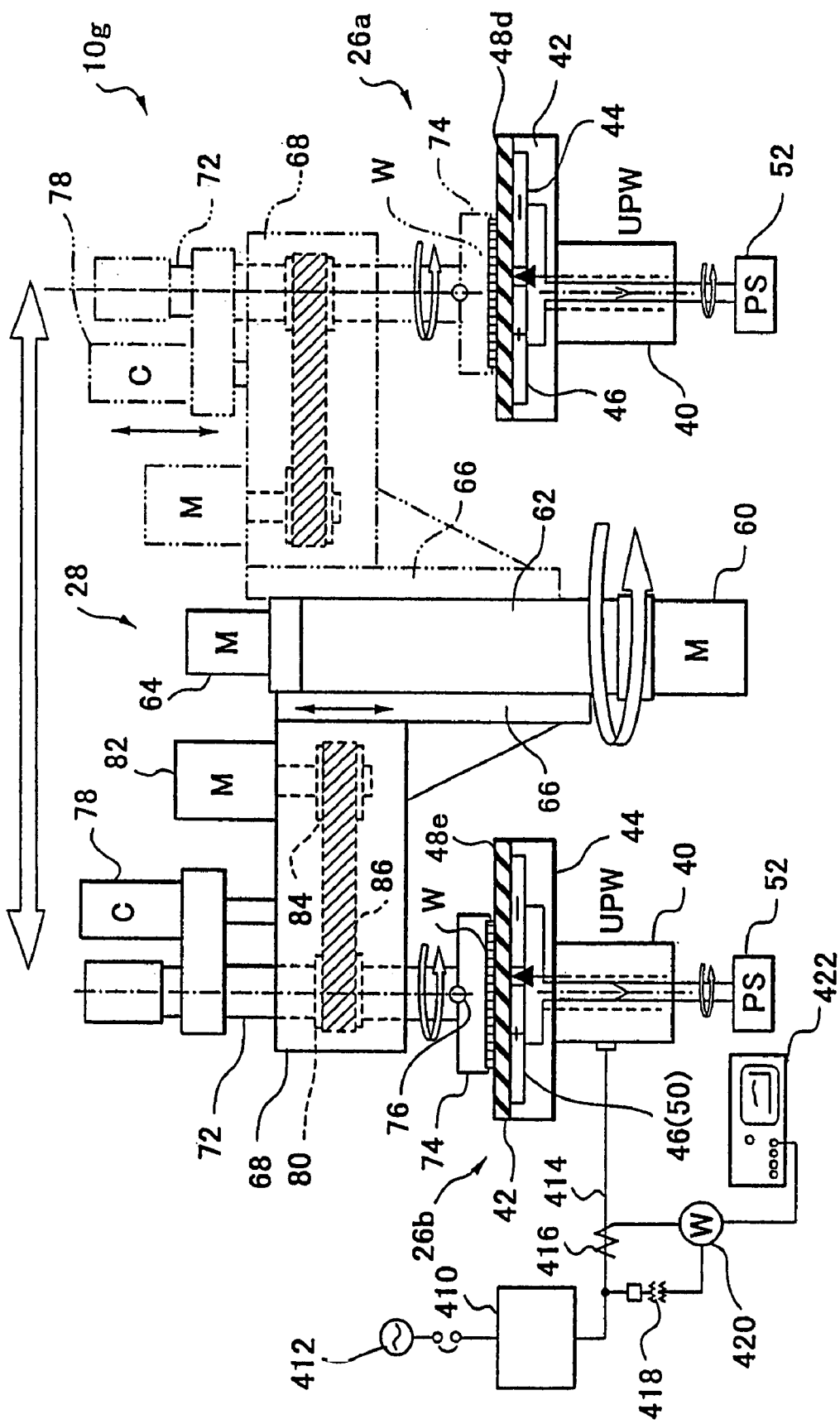
FIG. 16 is a front view showing the eighth embodiment of the present invention.
Figure 17:
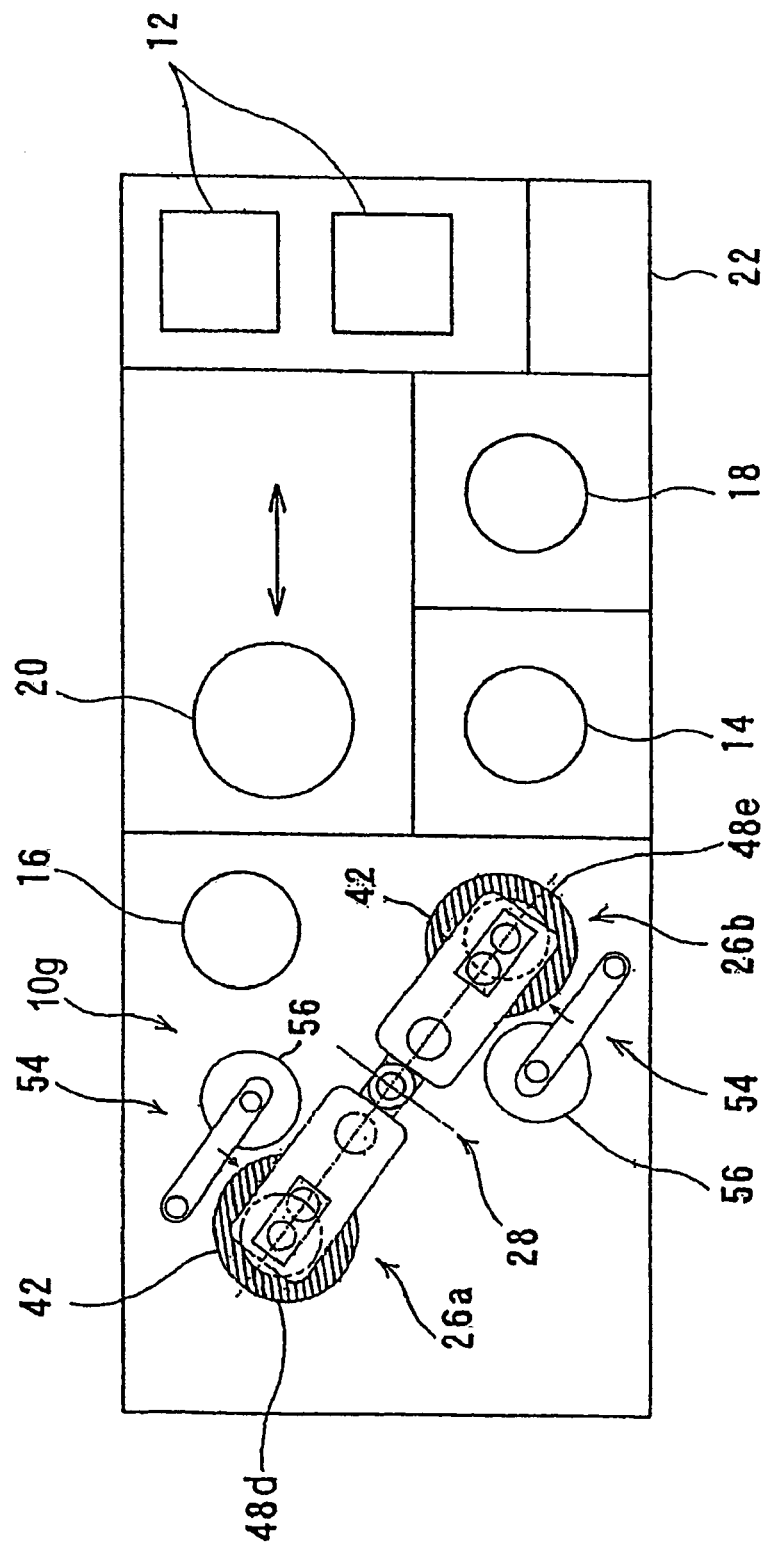
FIG. 17 is a block diagram showing an entire configuration of a substrate processing system equipped with the substrate processing apparatus shown in FIG. 15 and FIG. 16.

FIG. 15 and FIG. 16 show a substrate processing apparatus 10g according to an eighth embodiment of the present invention, and FIG. 17 shows an entire configuration of a substrate processing system having this substrate processing apparatus 10g. As shown in FIG. 17, this substrate processing system comprises a pair of load/unload sections 12 as a carry in/out section for carrying into or out from a cassette accommodating therein a substrate W having, for example, copper coating 6 (shown in FIG. 22(b)) as a conductive film (a section to be processed) on a surface thereof, a reversing machine 14 for reversing the substrate W, a pusher 16 for receiving or delivering the substrate, a cleaning device 18, and the substrate processing apparatus 10g. Further, disposed at a position surrounded by the load/unload sections 12, reversing machine 14, pusher 16, and cleaning device 18 is a carrier robot 20 of a running type as a carrier for carrying the substrate W for transferring between these components. Further, a control section 22 is provided. This control section 22 performs various types of controls such as those over a voltage applied to between processing electrode 44 and feeding electrode 46, or a current flowing between these two electrodes.

A plurality of electrolytic processing sections are provided in the substrate processing apparatus 10g. For instance, in the examples shown in FIG. 15 and FIG. 16, two electrolytic processing sections, namely a first electrolytic processing section 26a and a second electrolytic processing section 26b, each for etching a surface of a substrate by performing electrolytic processing with ultrapure water or deionized water, are provided, and a carrier section 28 for releasably holding a substrate W and carrying it between the first electrolytic processing section 26a and the second electrolytic processing section 26b is disposed therebetween.

The first electrolytic processing section 26a and the second electrolytic processing section 26b each have processing table 42 which is connected to hollow motor 40 and performs an orbital motion not associating with rotation of itself, namely the so-called "translational movement" (scroll movement) in accordance with rotation of the hollow motor 40. This processing table 42 comprises an insulating body, and processing electrodes 44 and feeding electrodes 46 each having a fan-shaped form are embedded in a top surface of this processing table 42 with a predetermined space along a periphery thereof. A first ion exchanger 48d is mounted on the processing electrodes 44 and the feeding electrodes 46 in the first electrolytic processing section 26a, while a second ion exchanger 48e is mounted on the processing electrodes 44 and feeding electrodes 46 in the second electrolytic processing section 26b.

The first ion exchanger 48d used in the first electrolytic processing section 26a has high elasticity and is hard to deform, while the second ion exchanger 48e used in the second electrolytic processing section 26b has lower elasticity (or a lower elastic modulus and is easier to deform as compared to the first ion exchanger 48d). The ion exchanger 48d having the high elasticity is, for instance, Nafion 117 (produced by DuPont Corp.). The ion exchanger 48e with low elasticity is, for instance, woven cloth or non-woven cloth graft-polymerized and having an ion exchange capability.

Needless to say that ion exchangers having any form or structure including the three-layered structure used in the substrate processing apparatus 10c shown in FIG. 10 may be used for the ion exchangers 48d, 48e.

Further, the first electrolytic processing section 26a is different from the second electrolytic processing section 26b only in that types of ion exchangers used in respective electrolytic processing sections are different (in terms of elasticity) from each other, and other portions of these configurations are identical. Therefore, the expression of "ion exchanger 48" is used for both the ion exchanger 48d in the first electrolytic processing section 26a and the ion exchanger 48e in the second electrolytic processing section 26b.

Provided inside the hollow motor 40 is a deionized water supply tube extending thereinto from outside (not shown), and a through-hole opened on a top surface of the processing table 42 communicating with the deionized supply tube is provided at a center of the processing table 42. With this configuration, deionized water, or preferably ultrapure water is supplied through this deionized supply tube and the through-hole to the ion exchangers 48 on the top surface of the processing table 42.

Further as shown in FIG. 15, provided at a side of each processing table 42 is a regenerating section 54 for regenerating the ion exchanger 48. This regenerating section 54 comprises an oscillating arm 56 capably of freely oscillating, and a regeneration head 58 held at a free end of this oscillating arm 56, and can regenerate the ion exchanger 48 even during processing by applying a voltage reverse to that applied during processing to the ion exchanger 48 to promote dissolution of deposits such as copper deposited on the ion exchanger 48. Regenerated ion exchanger 48 is rinsed with deionized water or ultrapure water supplied onto a top surface of the processing table 42.

The carrier section 28 has a pivot 62 which pivots when it is driven by a motor attached to a lower end thereof and is positioned between the electrolytic processing section 26a and the electrolytic processing section 26b. This pivot 62 has a elevating plate 66 which moves up and down when driven by elevating motor 64 attached to an upper end thereof, and a base edge section of top ring head 68 extending in a horizontal direction is fixed to this elevating plate 66. An elevating section 72 is provided at a free edge of this top ring head 68, and a top ring 74 for releasably holding a substrate W is joined thereto via a ball joint 76 in a manner allowing the top ring 74 to freely incline.

Parallel to the elevating shaft 72, a cylinder 78 for moving up and down the elevating shaft 72 is provided. A timing belt 86 connects a section between driven pulley 80 attached to this elevating shaft 72 with a drive pulley 84 attached to a pivot of this motor 82 for rotating the top ring, and when driven by the motor 82, the top ring 74 rotates monolithically with the elevating shaft 72.

With this configuration, the top ring head 68 is oscillated to move the top ring 74 to a position directly above the pusher 16 shown in FIG. 17, and then pusher 16 is moved upward so that the top ring head 68 can receive the substrate W. Then in a state where the top ring 74 holds the substrate W, the top ring head 68 is oscillated to mount the top ring 74 on the processing table 42 in either the first electrolytic processing section 26a or the second electrolytic processing section 26b. The top ring 74 is descended to move the substrate W to a position close to or contacting the ion exchanger 48 on the processing table 42, and in this state, the processing table 42 and the top ring 74 are rotated, and a voltage is applied between processing electrode 44 and feeding electrode 46 while supplying deionized water or ultrapure water to the ion exchangers 48 on a top surface of the processing table 42. With this operation, a top surface (undersurface) of the substrate W is electrolytically processed (etched).

Next substrate processing (electrolytic processing) with this substrate processing system is described below. At first, one substrate W is taken out by a carrier robot 20 from a cassette accommodating therein substrates W having copper coating 6 formed as a conductive film (a processed section) on a surface thereof and set in the load/unload section 12, and the substrate W is carried to and reversed on the reversing machine 14, if required, to position the substrate W so that the surface with the copper coating 6 formed thereon faces downward. Then the substrate turned upside down is carried by the carrier robot 20 to the pusher 16 and is placed on the pusher 16. Then the top ring head is pivoted to move the top ring 74 to a position just above the pusher 16, and then the pusher 16 is raised to such and the substrate W is held on the pusher 16 with the top ring 74.

Thereafter, in a state where the substrate W is held by the top ring 74, the top ring head 68 is pivoted to move the top ring 74 to a position above the processing table 42 in the first electrolytic processing section 26a. Then the top ring 74 is descended, and the substrate W held by the top ring 74 is moved to a position close to or contacting the ion exchanger 48d on the processing table 42. In this state, the processing table 42 and the top ring 74 are rotated, and concurrently a voltage is applied between the processing electrode 44 and the feeding electrode 46 while supplying deionized water or preferably ultrapure water to the ion exchanger 48e on a top surface of the processing table 42; thus, a top surface (undersurface) of the substrate is electrolytically processed.

In the first electrolytic processing section 26a, polishing is performed by using an ion exchanger 48 with a smooth surface and high elasticity to eliminate steps generated on a surface of the copper coating 6 laminated on the substrate W. Namely, if the ion exchanger is soft and easily deforms, the ion exchanger easily follows irregularities on a surface of the copper coating 6, and in that case it is difficult to selectively eliminate convex sections on the surface. When an ion exchanger with a smooth surface and low elasticity (is hard to deform) is used, processing proceeds only in sections contacted by the copper coating 6, so that steps thereof are eliminated.

When polishing of the copper film 6 proceeds on the substrate W and it is determined that steps have been eliminated, power is disconnected with the top ring 74 raised, and rotation of the processing table 42 and top ring 74 is stopped.

Then in a state where the substrate W is held by the top ring 74, the top ring 68 is pivoted to move the top ring 74 to a position above the processing table 42 in the second electrolytic processing section 26b. Then the top ring 74 is descended, and the substrate W held by the top ring 74 is moved to a position close to or contacting the ion exchanger 48e on the processing table 42, and in this state, the processing table 42 and the top ring 74 are rotated with deionized or ultrapure water being supplied to the ion exchanger 48e on a top surface of the processing table 42, and in this state a voltage is applied between the processing electrode 44 and feeding electrode 46 to electrolytically machine a top surface (undersurface) of the substrate.

In the second electrolytic processing section 26b, polishing of the copper coating 6 is performed by using ion exchanger 48e with a smooth surface and low elasticity. Namely, it is necessary to execute processing for removing the copper coating 6 down to a predetermined film thickness even after the steps have been eliminated, and in that case, as a surface of the copper film 6 is flat, an ion exchanger with high elasticity is not required. For this reason, for processing the copper coating 6 after the steps have been eliminated, an ion exchanger with low elasticity may be used. As polishing of the substrate W proceeds on the substrate W and it is detected that the barrier metal (barrier layer) 5 comprising material such as TaN has been exposed, power 52 is disconnected with the top ring 74 raised, and rotation of the processing table 42 and top ring 74 is stopped.

It is not necessary to change such factors as a relative speed when processing is performed in the first electrolytic processing section 26*a* and the second electrolytic processing section 26*b*. However, a lower current density is better for effectively eliminating the steps. Therefore, the current density is preferably set to a relatively lower level when processing for flattening is performed in the first electrolytic processing section 26*a*, while the current density is preferably set to a relatively higher level for processing in the second electrolytic processing section 26*b* after flattening to remove steps on an entire surface of the substrate at a high speed. Further for processing in the first electrolytic processing section 26*a*, it is preferable to use ultrapure water as a solution to be supplied for flattening, but for processing in the second electrolytic processing section 26*b*, since the surface has already been made flat, a solution containing electrolytes may be used as a processing solution for performing processing at a high speed. In that case, it is not necessary to position an ion exchanger in the second electrolytic processing section 26*b*. Further, when a film thickness is larger as compared to the steps, processing with an electrolytic solution may be performed first in the second electrolytic processing section 26*b* and then processing is performed with ultrapure water in the first electrolytic processing section 26*a*.

After polishing is finished, the top ring head 68 is pivoted to deliver the substrate W to the pusher 16. The carrier robot 20 receives the substrate W from this pusher 16, and carries the substrate W to the reversing machine 14 to reverse the substrate. The carrier robot further carries the substrate W to the cleaning device 18, and then returns cleaned substrate W to the load/unload section 12.

Figure 18:
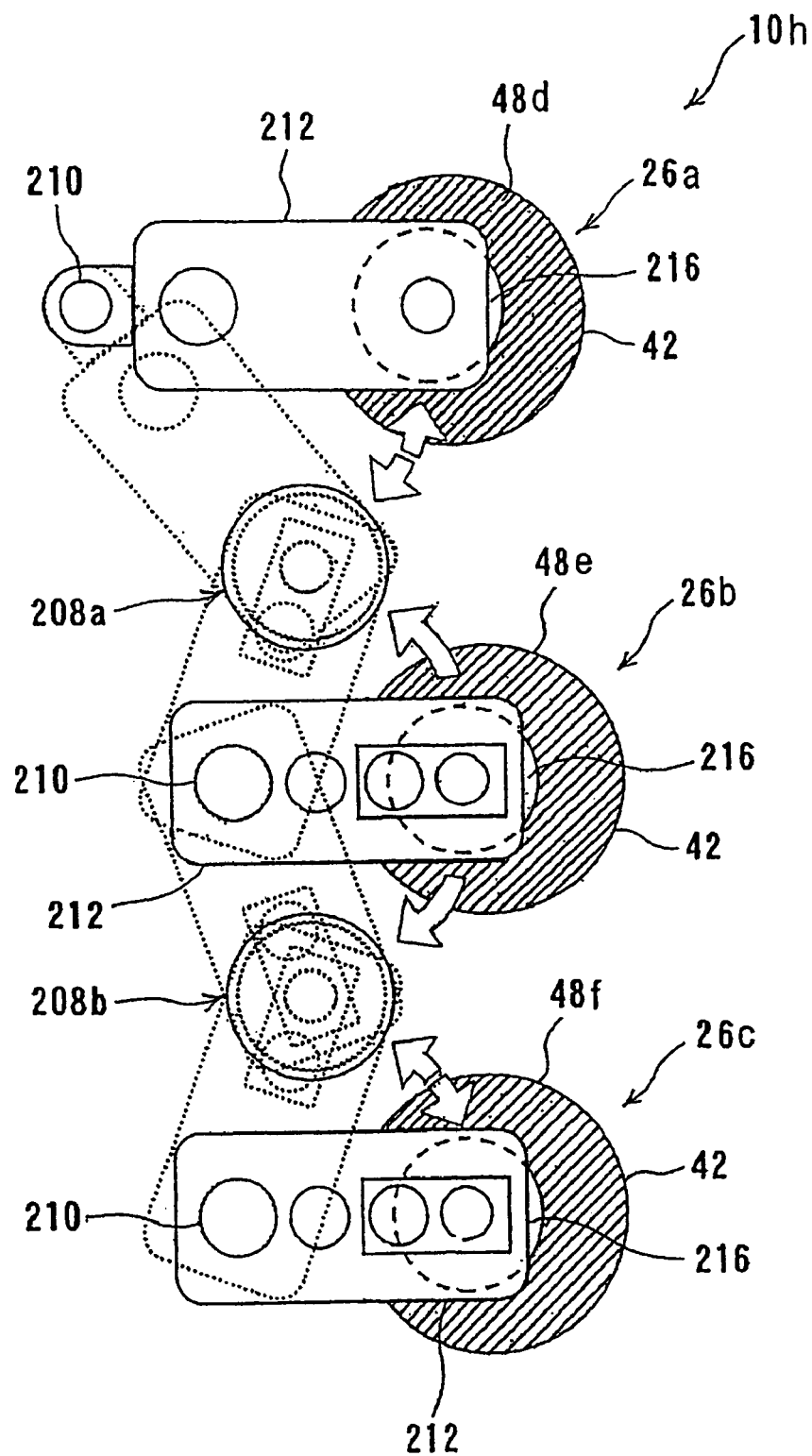
FIG. 18 is a flat view showing a substrate processing apparatus according to a ninth embodiment of the present invention.

FIG. 18 shows a substrate processing apparatus 10*h* according to a ninth embodiment of the present invention. This substrate processing apparatus 10*h* has, in addition to a first electrolytic processing section 26*a* and a second electrolytic processing section 26*b* having a configuration similar to those in the substrate processing apparatus 10*g* shown in FIG. 15 and FIG. 16, a third electrolytic processing section 26*c*, and pushers 208*a*, 208*b* each having a load/unload mechanism are provided between the first electrolytic processing section 26*a* and the second electrolytic processing section 26*b*, and between the second electrolytic processing 26*b* and the third electrolytic processing 26*c*. This third electrolytic processing section 26*c* uses, as third ion exchanger 48*f*, an ion exchanger which is best suited for polishing and removing barrier metal (barrier layer) 5 as shown in FIG. 22(*a*). Other portions of this configuration are similar to those of the first electrolytic processing section 26*a* and the second electrolytic processing section 26*b*.

Provided at a side of each of the first electrolytic processing section 26*a*, second electrolytic processing section 26*b*, and third electrolytic processing section 26*c* is a pivot 210 which is freely pivotable. With this configuration, substrate W placed on the pusher 208*a* or 208*b* is sucked and held by top ring 216 moved to a position just above the pusher 208*a* or 208*b* by swiveling an arm 212 via the pivot 210, and the substrate W held by the top ring 216 is moved to a position above processing table 42 by pivoting the pivot 210, and is subjected to electrolytic processing (etching) at the position, and further substrate W having been subjected to this electrolytic processing is moved to a position just above the pusher 208*a* or 208*b* by pivoting the pivot 210 to return it to the pusher 208*a* or 208*b*.

In this case, as described above, the substrate W having been polished so that the barrier metal 5 comprising, for instance, TaN is exposed is placed on the pusher 208*b*, and then this substrate W is carried to the third electrolytic processing section 26*c*, and the barrier metal 5 is polished and removed in this third electrolytic processing section from the substrate W. When it is detected that a surface of the copper coating 6 filled in the groove 4 for wiring, as well as in the contact hole 3, and a surface of the insulating film 2 is almost in the same plane, and that wiring comprising a copper line has been formed as shown in FIG. 22(*c*), it is determined that polishing is finished. Then polished substrate W is returned to the cassette in the load/unload section 12 via the pushers 208, 208*b* or the like in the same way as described above.

With this configuration, processing, for instance, for removal of barrier metal 5 can efficiently be executed under different conditions in the third electrolytic processing section 26*c* using the ion exchanger 48*f* different from both first ion exchanger 48*d* and second ion exchanger 48*e*.

Although, in this example, the barrier metal 5 is polished and removed in the third electrolytic processing section 26*c*, a chemical-mechanical polishing section for chemically and mechanically polishing a substrate may be provided in place of this third electrolytic processing section 26*c* for processing and removing the barrier metal by chemical-mechanical polishing (CMP) using a polishing pad and slurry in this chemical-mechanical polishing section.

Figure 19:
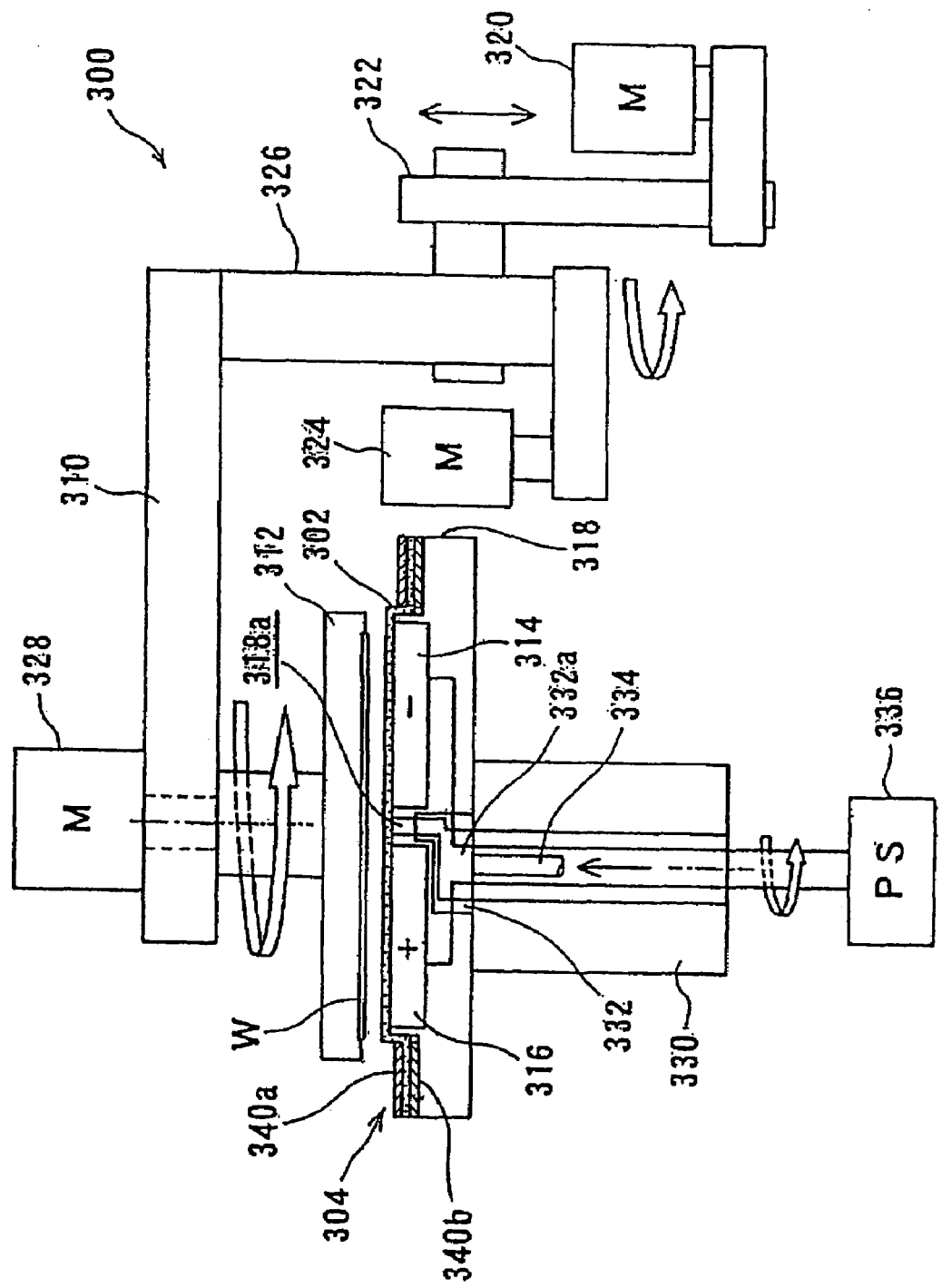
FIG. 19 is a partially cut front view showing an electrolytic processing section of a substrate processing apparatus according to a tenth embodiment of the present invention.
Figure 20A:
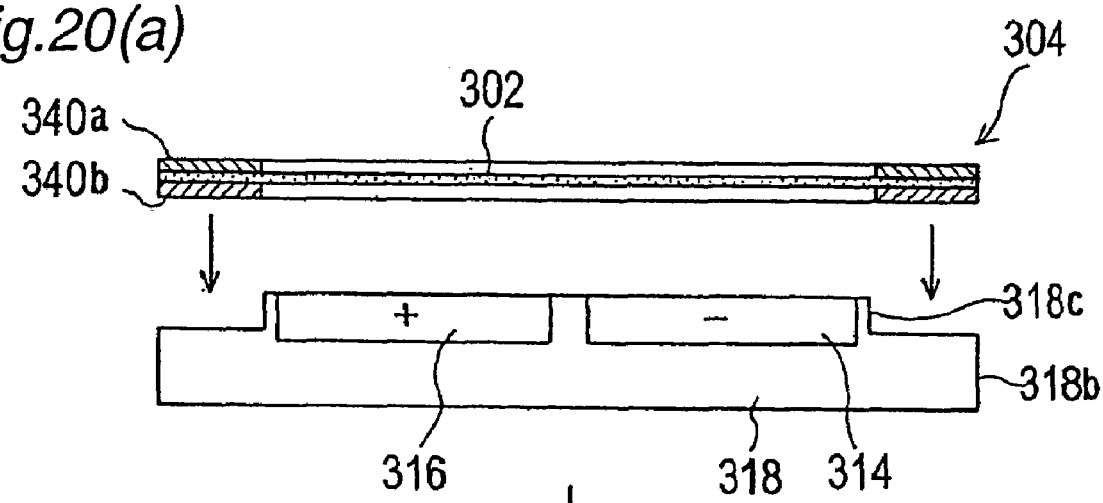
FIG. 20(a) and FIG. 20(b) are views each showing a state where an ion exchanger holder section is mounted in a electrode section of the substrate processing apparatus according to the tenth embodiment of the present invention.
Figure 20B:
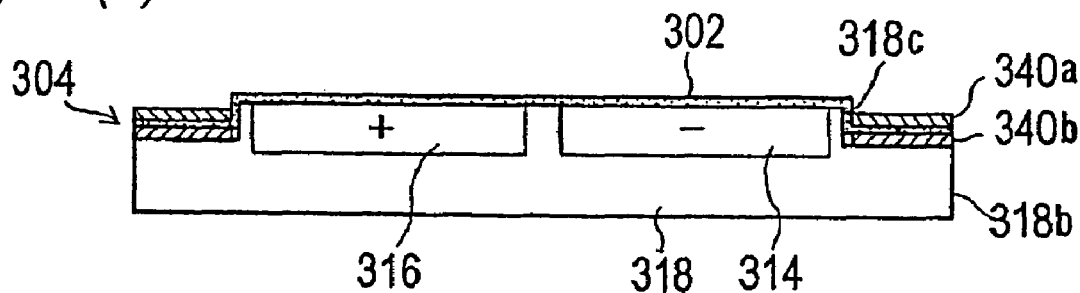
Figure 21:
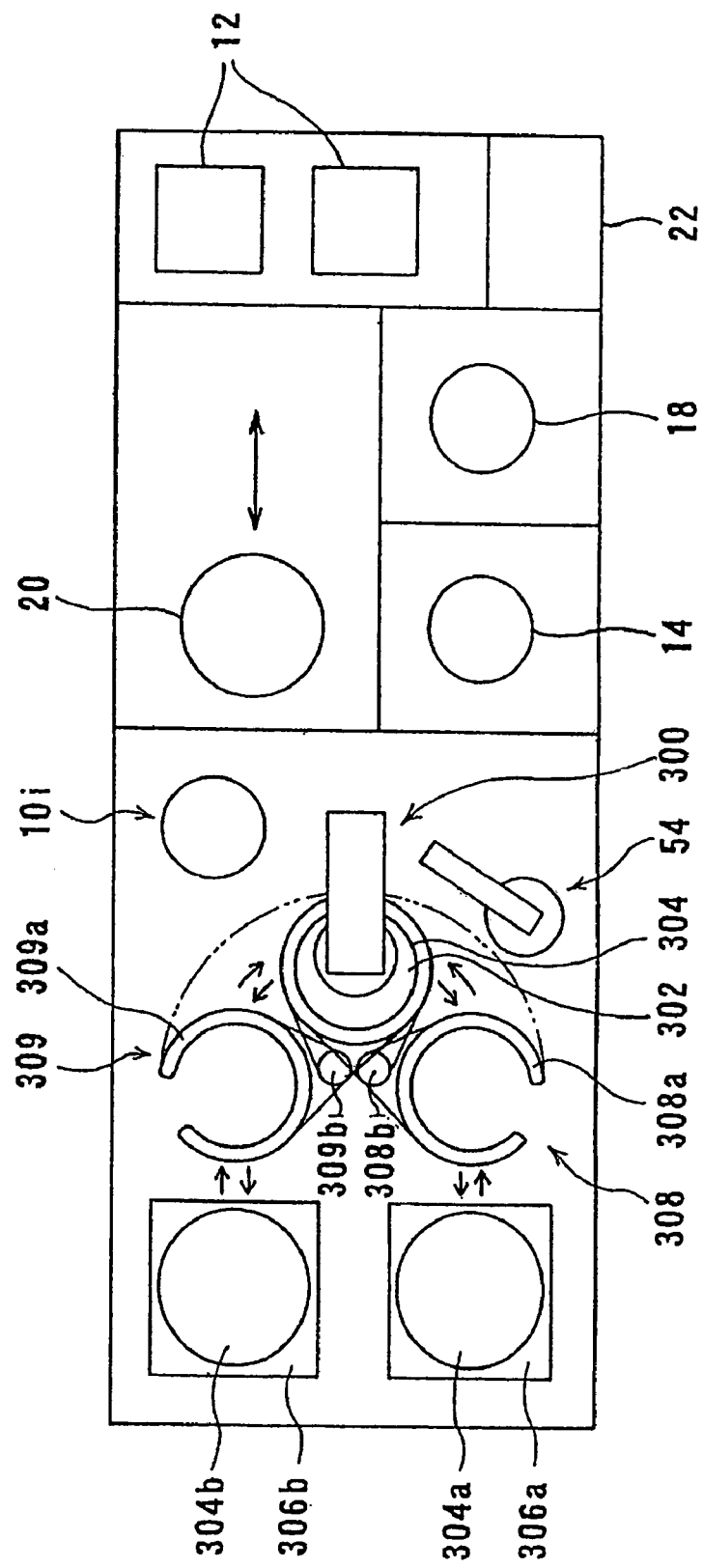
FIG. 21 is a block diagram showing an entire configuration of a substrate processing system equipped with the substrate processing apparatus shown in FIG. 19 and FIGS. 20(a) and 20(b)

FIG. 19 shows an electrolytic processing section 300 in a substrate processing apparatus 10*i* according to a tenth embodiment of the present invention; FIG. 20(*a*) and FIG. 20(*b*) show a state where an ion exchanger holding section 204 holding an ion exchanger 302 thereon is set on an electrode section 318 of an electrolytic processing section 318; and FIG. 21 shows a general configuration of a substrate processing system having this substrate processing apparatus 10*i* therein. This substrate processing apparatus 10*i* comprises, as shown in FIG. 21: an electrolytic processing section 300; stockers 306*a*, 306*b* for accommodating a plurality of ion exchanger holding members 304*a*, 304*b* of a cartridge type each having, for instance, a cartridge form and holding a film-formed ion exchanger therein; and carrier robots 308, 309 each as an ion exchanger holding section exchange device for exchanging ion exchanger holding members 304*a*, 304*b* provided in the electrolytic processing section 300 with ion exchanger holding members 304*a*, 304*b* stored in the stockers 306*a*, 306*b*. Other portions of the configuration of the substrate processing system are similar to those shown in FIG. 17, so that same reference numerals are assigned to same or corresponding members as those shown in FIG. 17 and detailed description thereof is omitted herefrom. The robots 308, 309 pivot on pivots 308*b*, 309*b* respectively, and the ion exchanger holding members 304*a*, 304*b* are reciprocally moved between the stokers 306*a*, 306*b* and the electrolytic processing section 300 with arms 308*a*, 309*a*, respectively.

The electrolytic processing section 300 comprises a substrate holding section 312 provided under a free end of oscillating arm 310 capable of freely oscillating in a horizontal direction for holding a substrate in a face-down position, and an electrode section 318 having a disk-shaped form and comprising an insulating body with processing electrodes 314 and feeding electrodes 316 embedded therein so that top surfaces of the processing electrodes 314 and feeding electrodes 316 are alternately exposed in the same plane at upper and lower positions respectively. An ion exchanger holding section 304 for holding the ion exchanger 302 is releasably provided in an upper section of the electrode section 318, and when this ion exchanger holding section 304 is mounted in the upper section of the electrode section 318, the ion exchanger 302 covers the surfaces of the processing electrodes 314 and feeding electrodes 316.

In this example, an electrode section 318 having a diameter slightly larger than that of substrate W held on the substrate holding section 312 is used as the electrode section 318 having the processing electrodes 314 and the feeding electrodes 316 thereon, and the electrode section 318 is relatively moved (scrolled) so that an entire surface of the substrate W can simultaneously be electrolytically processed.

The oscillating arm 310 for oscillating the substrate holding section 312 is joined to an upper edge of the oscillating shaft 326 moving up and down via a ball screw 322 in accordance with drive of the motor 320, and also rotating in accordance with drive of the motor 324 for oscillating movement. Further the substrate holding section 312 is connected to the a free edge of the oscillating arm 310, and is rotated by a drive motor 328.

The electrode section 318 is directly connected to a hollow motor 330 and is adapted to perform a scroll-type movement (translational movement) under a driving operation of the hollow motor. Provided in a central portion of the electrode section 318 is a through hole 318a which acts as a deionized water supply portion for supplying deionized water, preferably, ultrapure water. The through hole 318a is in fluid communication with deionized water supply tube 334 extending through an inside of a hollow portion of the hollow motor 330, through a through hole 332a formed in a crank shaft 332 which is directly connected to a drive shaft of the hollow motor 330 which operates to cause scroll-type movement of the electrode section. The deionized water or ultrapure water is supplied through the through hole 332a and then is supplied to an entire workpiece surface through water absorptive ion exchanger 302.

The ion exchanger 302 is held by the ion exchanger holding portion 304 having a pair of separate fixing members 340a, 340b made of a ring-shaped insulator. The ion exchanger is adapted to be fixed to and contacts exposed surfaces of the processing electrodes 314 and the feeding electrodes 316 in a condition that it extends evenly over an entire surface thereof (under predetermined tension). Namely, as shown in detail in FIG. 20(a) and FIG. 20(b), the electrode section 318 includes a base portion 318b having a large diameter and an electrode supporting portion 318c integrally connected to an upper surface of the base portion, and having a circular cylindrical shape with a small diameter. The ion exchanger 302 is temporarily fixed to the electrode supporting portion 304 with a peripheral portion thereof being clamped by the pair of separate fixing members 340a, 340b and fixed by bolts and the like, and then is held by the electrode supporting portion 304. Under such a condition, the ion exchanger 302 is fixed by fitting the ion exchanger holding section 304 holding the ion exchanger to the electrode supporting portion 318c to fix the ion exchanger holding section 304 to the electrode supporting portion 318c, whereby the ion exchanger is fixed to the electrode supporting portion.

Thus, when the ion exchanger holding section 304 is fitted to the electrode supporting portion, slippage is prevented from occurring between the ion exchanger 302 and the ion exchanger holding section 304. The ion exchanger is thus fixed to the electrode supporting section, while a predetermined tension is applied to the ion exchanger. The ion exchanger is formed to have a multi-layer structure by stacking a plurality of like ion exchanging layers, or a plurality of different ion exchanging layers, one on another.

In this example, the robot 308 for exchanging has a pair of arms 308a capable of being freely opened or closed, and the arms 308a hold the ion exchanger holding section 304 holding the ion exchanger. With this configuration, the ion exchanger holding section 304 mounted in the electrode section 318 can be exchanged with the ion exchanger holding section 304 accommodated in the stocker 306. Namely, the robot 308 for exchanging is moved to a position where the arms 308a surround the ion exchanger holding section 304 set on the electrode section 318, and in this state, the arms 308a hold the ion exchanger holding section 304 from both sides thereof. Then the arms 308a are moved upward to pull off the ion exchanger holding section 304 from the electrode support section 318c of the electrode section 318, and then carry the ion exchanger holding section 304 into the stocker 306. In this state the arms 308a are separated from each other to accommodate the ion exchanger holding section 304 in the stocker 306.

Then the arms 308a of the robot 308 for exchanging are moved to a position where the arms 308a surround the ion exchange holding section 304 accommodated in the stocker to be exchanged, and in this state the arms 308a are closed with each other and hold the ion exchanger 304 in the stocker 306 from both sides thereof. Then this ion exchanger holding section 304 is carried to a position above the electrode support section 318c of the electrode section 318, and the arms 308a are descended to push the ion exchanger holding section 304 into the electrode support section 318c of the electrode section 318 for engaging it therein to fix the ion exchanger holding section 304 in the electrode support section 318c; thus, the ion exchanger 302 being fixed. Then the arms 308a are separated from each other to release the ion exchanger holding section and return the robot 308 for exchanging to an original position.

In this example, by exchanging the ion exchanger 302 used for processing in the electrolytic processing section 300, for instance, via the cartridge type of ion exchanger holding section 304 for holding the ion exchanger 302 with another one, a plurality of types of electrolytic processing can be performed with a plurality of ion exchangers having different characteristics, respectively, under different conditions in a single electrolytic processing section 300.

An example of exchanging an ion exchanger with a robot was described above, but the ion exchanger may be exchanged with another one by an operator. In that case, a mechanism for dismountably fixing the ion exchanger holding members 304a, 304b is provided on the electrode section 318.

In this example, substrate W is sucked and held by the substrate holding section 312 in the electrolytic processing section 300 in a way similar to those described above, and the substrate holding section 312 is moved to a processing position just above the electrode section 318 by pivoting the oscillating arm 310. Then the motor 320 is driven to descend the substrate holding section 312, and the substrate W held by the substrate holding section 312 is contacted with, or moved to a position close to, a surface of the ion exchanger 302 placed on a top surface of the electrode section 318 via the ion exchanger holding section 304. In this state, a predetermined voltage is applied from power supply unit 336 to between the processing electrodes 314 and the feeding electrodes 316 while concurrently supplying deionized water or ultrapure water to a top surface of the electrode section 318 from an under side of the electrode section 318, and at the same time the substrate holding section 312 is rotated with the electrode section 318 scrolled; thus, electrolytic processing being performed.

In this step, the ion exchanger holding section 304 holding the ion exchanger 302 suited to electrolytic processing is selected, and this ion exchanger holding section 304 is mounted on this electrode section 318. With this operation, electrolytic processing is performed by a desired ion exchanger. Namely the ion exchanger 302 is exchanged with a desired one in conformity with a processing condition of electrolytic processing via the ion exchanger holding section 304, and thus a plurality of types of electrolytic processing can be performed in a single electrolytic processing section by selectively using an ion exchanger suited to given processing conditions.

As descried above, according to the present invention, when electrolytic processing is performed by applying a voltage between a processing electrode, a feeding electrode, and a workpiece, a processing end point for electrolytic processing can surely be detected with a relatively simple configuration.

Further with the present invention, by employing electrolytic processing using deionized water or ultrapure water concurrently with a conventional type of chemical-mechanical polishing (CMP), such problems as contamination of semiconductor substrates with a polishing solution used during the chemical-mechanical polishing (CMP), high cost of a polishing solution or chemicals used for cleaning, and further negative effects on an environment from processing can be alleviated during processing for formation of a copper wiring or a contact.

Although the present invention has been described above in detail with reference to the drawings, the foregoing description is for explanatory purposes and is not intended to limit characteristics of the present invention. For example, the embodiments described above disclose only plate-like electrodes, but the present invention is not limited to such a structure. Feeding electrodes divided into several pieces or processing electrodes divided into several pieces, or elongated electrodes are also within the scope of the present invention. It should be understood that the foregoing description merely illustrates and explains preferred embodiments, and all modifications and changes within the scope of the spirit of the present invention are protected.

The entire disclosures of Japanese Patent Application Nos. 2002-23785, 2002-96230 and 2002-330039 filed on Jan. 31, Mar. 29 and Nov. 13, 2002, respectively, including specifications, claims, drawings and summary are incorporated herein by reference in their entirety.

The invention claimed is:

1. A method for processing a substrate, comprising:
   electrically processing a substrate by performing a first electrolytic processing in presence of a first processing liquid, said first electrolytic processing including contacting said substrate with a first processing member; and
   electrically processing said substrate by performing a second electrolytic processing in presence of a second processing liquid, said second electrolytic processing including contacting said substrate with a second processing member, a characteristic of said first processing member being different from a characteristic of said second processing member, and at least one of said first processing member and said second processing member comprises an ion exchanger;
   wherein said first processing liquid is different from said second processing liquid.

2. The method according to claim 1, further comprising:
   chemically and mechanically polishing a surface of said substrate.

3. The method according to claim 2, wherein said chemically and mechanically polishing the surface of said substrate comprises removing a barrier layer from said substrate.

4. The method according to claim 1, wherein an electric conductivity of said first processing liquid is lower than an electric conductivity of said second processing liquid.

5. The method according to claim 1, wherein said first processing member has a first elasticity, and said second processing member has a second elasticity, with said first elasticity being greater than said second elasticity.

6. The method according to claim 1, wherein a current density employed for said first electrolytic processing is lower than a current density employed for said second electrolytic processing.

7. The method according to claim 1, wherein said performing said first electrolytic processing comprises performing said first electrolytic processing until steps on said substrate are eliminated.

8. The method according to claim 1, further comprising: detecting a processing end point by detecting a change in a frictional force generated between said substrate and at least one of a processing electrode and a feeding electrode during performance of at least one of said first electrolytic processing and said second electrolytic processing.

9. The method according to claim 1, further comprising: detecting a processing end point by detecting a change in an amount of heat generated between said substrate and at least one of a processing electrode and a feeding electrode during performance of at least one of said first electrolytic processing and said second electrolytic processing.

10. The method according to claim 1, further comprising: detecting a processing end point by detecting a change in amplitude of light reflected from a processed surface of said substrate.

11. The method according to claim 1, further comprising: detecting a processing end point by detecting a change in an eddy current generated inside said substrate during performance of at least one of said first electrolytic processing and said second electrolytic processing.

12. The method according to claim 1, further comprising: detecting a processing end point by detecting and integrating a current flowing between a processing electrode and a feeding electrode during performance of at least one of said first electrolytic processing and said second electrolytic processing.

13. The method according to claim 1, further comprising: regenerating the processing member employed for performance of at least one of said first electrolytic processing and said second electrolytic processing.

14. The method according to claim 1, wherein said performing said first electrolytic processing comprises removing conductive materials on a surface of said substrate, and said performing said second electrolytic processing comprises removing a barrier layer on the surface of said substrate.

* * * * *